United States Patent
Li

(10) Patent No.: US 11,105,858 B2
(45) Date of Patent: Aug. 31, 2021

(54) PREDICTING A POTENTIAL FAULT IN A BATTERY

(71) Applicant: O2Micro, Inc., Santa Clara, CA (US)

(72) Inventor: Guoxing Li, Sunnyvale, CA (US)

(73) Assignee: O2Micro Inc., Santa Clara, CA (US)

(*) Notice: Subject to any disclaimer, the term of this patent is extended or adjusted under 35 U.S.C. 154(b) by 139 days.

(21) Appl. No.: 16/512,960

(22) Filed: Jul. 16, 2019

(65) Prior Publication Data
US 2020/0110134 A1    Apr. 9, 2020

Related U.S. Application Data

(60) Provisional application No. 62/740,860, filed on Oct. 3, 2018.

(51) Int. Cl.
*G01R 31/367* (2019.01)
*G01R 31/374* (2019.01)
*G01R 31/3842* (2019.01)

(52) U.S. Cl.
CPC ......... *G01R 31/367* (2019.01); *G01R 31/374* (2019.01); *G01R 31/3842* (2019.01)

(58) Field of Classification Search
CPC ............................ G01R 31/367; G01R 31/374; G01R 31/3842; G01R 31/389; G01R 19/16542; G01R 31/396; Y02E 60/10; H01M 10/4285; H01M 10/48
See application file for complete search history.

(56) References Cited

U.S. PATENT DOCUMENTS

| | | | | |
|---|---|---|---|---|
| 5,780,994 A * | 7/1998 | Sisemore | ............... | H01M 10/44 320/156 |
| 6,025,695 A * | 2/2000 | Friel | ................... | H02J 7/00036 320/106 |
| 6,744,394 B2 | 6/2004 | Liu et al. | | |
| 7,095,211 B2 | 8/2006 | Denning | | |
| 8,219,333 B2 | 7/2012 | Li | | |
| 2010/0188054 A1 * | 7/2010 | Asakura | ................ | H01M 4/136 320/161 |
| 2010/0201321 A1 * | 8/2010 | Asakura | ................. | G01R 31/52 320/132 |

(Continued)

OTHER PUBLICATIONS

Christofer et al., Diagnostic Method Combining the Lookup Tables and Fault Models Applied on a Hybrid Electric Vehicle (Year: 2016).*

*Primary Examiner* — Mohammad K Islam

(57) ABSTRACT

In a status detection system, a data acquisition circuit monitors statuses of a battery to generate status data. A storage medium stores a set of lookup tables. A lookup table of the lookup tables includes a set of datasets corresponding to a set of time frames. Each dataset includes digital values of parameters of the battery obtained in a corresponding time frame of the time frames. A controller receives the status data and updates the lookup tables based on the status data. The controller also obtains a current dataset of the parameters based on the status data, searches the lookup table for a previous dataset that matches the current dataset, compares a current value of a parameter in the current dataset with a previous value of the parameter in the previous dataset, and determines whether a potential fault is present in the battery based on a result of the comparison.

20 Claims, 12 Drawing Sheets

(56) References Cited

U.S. PATENT DOCUMENTS

| | | | |
|---|---|---|---|
| 2011/0298417 A1* | 12/2011 | Stewart | G01R 31/3648 320/107 |
| 2013/0041538 A1* | 2/2013 | Jin | B60L 50/16 701/22 |
| 2013/0110428 A1* | 5/2013 | Sun | G01R 31/3835 702/63 |
| 2016/0116548 A1* | 4/2016 | Ghantous | H01M 10/425 702/63 |
| 2020/0164763 A1* | 5/2020 | Holme | B60L 58/10 |

\* cited by examiner

PREDICTING A POTENTIAL FAULT IN A BATTERY

RELATED APPLICATION

This application claims priority to the U.S. Provisional Application with Ser. No. 62/740,860, filed on Oct. 3, 2018, which is hereby incorporated by reference in its entirety.

BACKGROUND

Rechargeable batteries are widely used in daily life in portable electronic applications such as mobile phones, tablets, laptops, headsets, and smartwatches. If a fault condition, e.g., an internal short circuit, is present in the battery, it can cause damage to the electronic device (e.g., a malfunction, explosion, or fire) and danger to a user. Thus, detecting a fault in a rechargeable battery is crucial to safety. However, a latent defect may exist in a battery, and the latent defect may not be detected until after the battery has been used for awhile and it is too late to take protective action. When the defect accumulates to a certain level, it may trigger thermal runaway and the battery will be short-circuited internally, causing permanent damage.

SUMMARY

Embodiments according to the present invention predict the possibility of a fault in a battery.

In embodiments, a status detection system for a battery includes a data acquisition circuit, a non-transitory machine-readable storage medium, and a controller. The data acquisition circuit monitors statuses of the battery to generate status data indicative of the statuses. The storage medium stores a set of machine-readable lookup tables. A lookup table of the lookup tables includes a set of datasets corresponding to a set of time frames. Each dataset of the datasets includes digital values of a set of parameters of the battery obtained in a corresponding time frame of the frames. The controller receives the status data and updates the lookup tables based on the status data. The controller also obtains a current dataset of the parameters based on the status data, searches the lookup table for a previous dataset that matches the current dataset, compares a current value of a parameter in the current dataset with a previous value of the parameter in the previous dataset, and determines whether a potential fault is present in the battery based on a result of the comparison.

BRIEF DESCRIPTION OF THE DRAWINGS

Features and advantages of embodiments of the claimed subject matter will become apparent as the following detailed description proceeds, and upon reference to the following drawings, wherein like numerals depict like parts.

DETAILED DESCRIPTION

Figure 1:
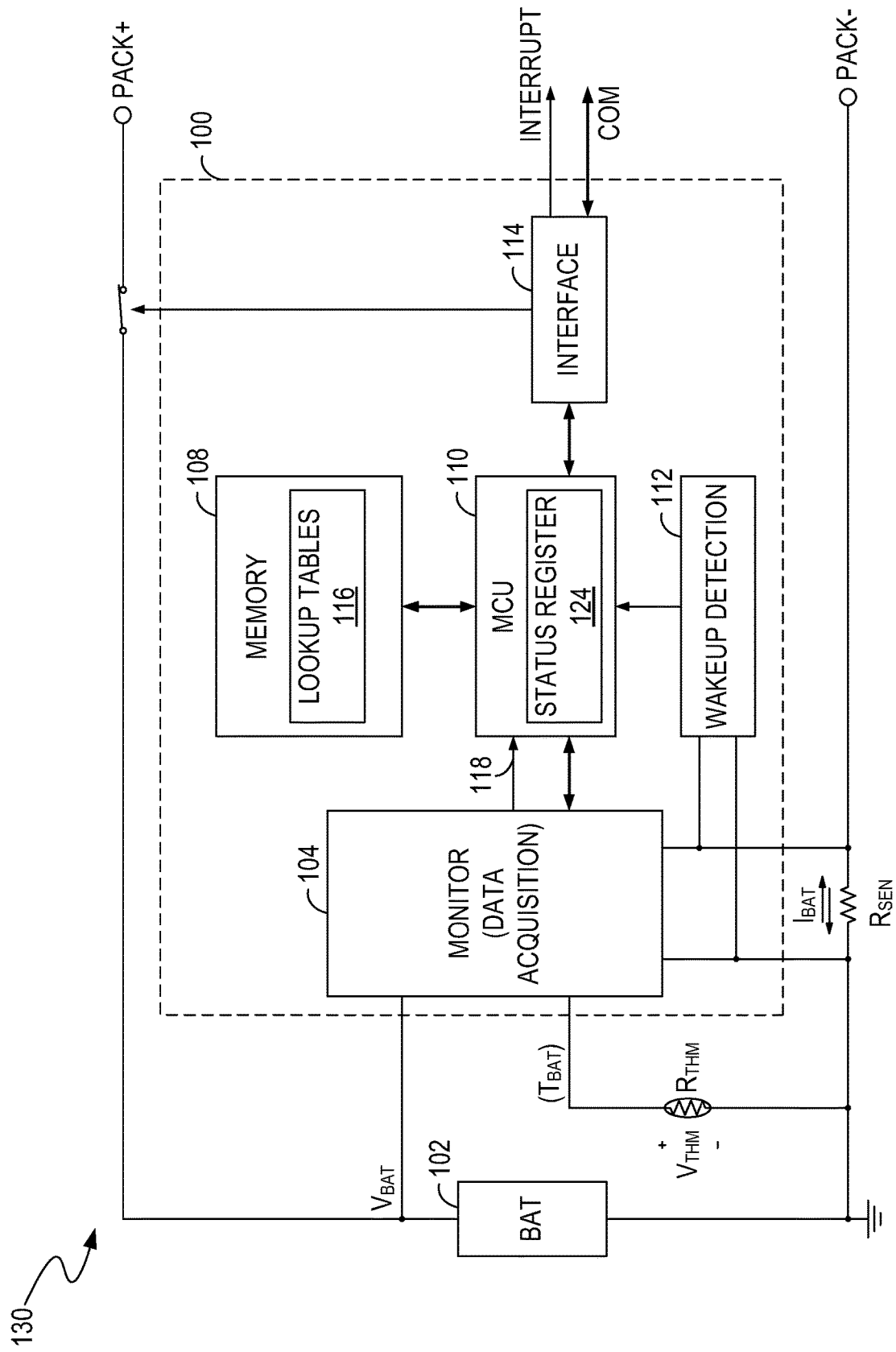
FIG. 1 illustrates a circuit diagram of an example of a status detection system for a battery pack, in an embodiment of the present invention.

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "monitoring," "updating," "generating," "storing," "obtaining," "indicating," "searching," "comparing," "determining," "calculating," "multiplying," or the like, refer to actions and processes of a computer system or similar electronic computing device, controller, or processor. The computer system or similar electronic computing device manipulates and transforms data represented as physical (electronic) quantities within the computer system memories, registers or other such information storage, transmission or display devices.

Portions of the detailed description that follows are presented and discussed in terms of methods. Although steps and sequencing thereof are disclosed in figures herein describing the operations of those methods, such steps and sequencing are examples only. Embodiments are well suited to performing various other steps or variations of the steps recited in the flowcharts of the figures herein, and in a sequence other than that depicted and described herein.

Embodiments described herein may be discussed in the general context of computer-executable instructions residing on some form of computer-readable storage medium, such as program modules, executed by one or more computers, controllers, or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above can also be included within the scope of computer-readable media.

Embodiments according to the present invention provide solutions to determine whether a latent defect or a potential fault, e.g., a potential internal short circuit, is present in a battery. As a result, protective actions (e.g., turning off the current loop, and/or changing the battery) can be taken in time (e.g., before the fault condition actually occurs) to protect the electronic device and its user.

FIG. 1 illustrates a circuit diagram of an example of a status detection system 100 for a battery 102 in a battery pack 130, in an embodiment of the present invention. The battery 102 can include one or more rechargeable battery cells, e.g., lithium-ion battery cells. The status detection system 100 includes a data acquisition circuit 104 (e.g., a monitor), a non-transitory machine-readable storage medium 108 (e.g., a memory), and a controller 110 (e.g., a microcontroller or processor). The status detection system 100 may also include a wakeup detection circuit 112 and an interface 114.

In an embodiment, the data acquisition circuit 104 includes an ADC (analog-to-digital converter) and monitors the status of parameters (e.g., a battery voltage $V_{BAT}$, a battery current $I_{BAT}$, and a battery temperature $T_{BAT}$) of the battery 102 to generate status data 118 indicative of the status of those parameters. For example, the data acquisition circuit 104 receives a battery voltage $V_{BAT}$ from a positive terminal of the battery 102, receives a sense voltage across a current sensor $R_{SEN}$ indicative of a battery current $I_{BAT}$, and receives a sense voltage $V_{THM}$ from a thermistor $T_{THM}$ indicative of a battery temperature $T_{BAT}$.

The storage medium 108 is configured to store a set of machine-readable lookup tables 116. Each lookup table of the lookup tables 116 includes a set of datasets corresponding to different time frames. Each dataset of the datasets includes digital value(s) of one or more parameters of the battery 102 obtained in a corresponding time frame. For example, digital values of the parameters in a first dataset are obtained in a first time frame, and digital values of the parameters in a second dataset are obtained in a second time frame following the first time frame. A "time frame" as used herein can be a period of time or a point in time.

The controller 110 receives the status data 118 from the data acquisition circuit 104 periodically, and stores the status data 118 in a status register 124. The controller 110 also updates the lookup tables 116 in the storage medium 108 based on the status data 118. In an embodiment, the controller 110 obtains a current dataset of the parameter values based on the status data 118, searches a corresponding lookup table for a previous dataset that matches the current dataset, compares a current value of a parameter in the current dataset with a previous value of the parameter in the previous dataset, and determines whether a potential fault, e.g., a potential short circuit, is present in the battery 102 based on a result of the comparison. Detailed explanations are presented as follows.

Figure 2:
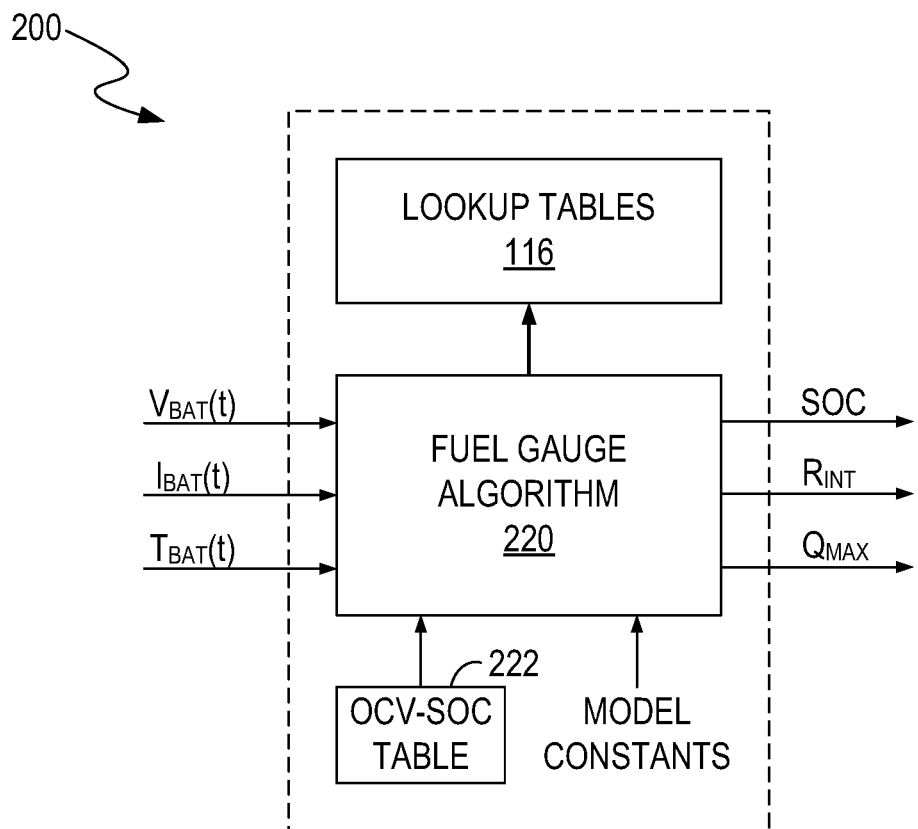
FIG. 2 illustrates an example of a software topology diagram for updating lookup tables stored in a memory, in an embodiment of the present invention.

FIG. 2 illustrates an example of a software topology diagram 200 for updating the lookup tables 116 stored in the storage medium 108, in an embodiment of the present invention. FIG. 2 is described in combination with FIG. 1. In an embodiment, the controller 110 can perform/execute fuel gauge algorithms 220 to estimate/calculate values of a set of parameters of the battery 102 based on the monitored battery voltage $V_{BAT}(t)$ battery current $I_{BAT}(t)$, and battery temperature $T_{BAT}(t)$, and also based on an OCV-SOC table 222. The OCV-SOC table 222 is an open-circuit voltage (OCV) versus state of charge table, and it lists values of the state of charge SOC corresponding to different open-circuit voltages of a battery. The parameters can include, but are not limited to, a state of charge SOC, an internal resistance $R_{INT}$, a maximum charge capacity, a battery voltage change dV, a battery temperature change dT, a time length dt, an average battery current AVG_I, an average battery temperature AVG_T, and an average battery voltage AVG_V.

The invention is not limited to using the specific fuel gauge algorithms described herein. In other words, other kinds of fuel gauge algorithms 220 can be used to estimate/calculate the abovementioned parameters. In an embodiment, the controller 110 updates the lookup tables 116 according to the estimated/calculated values of the parameters. In an embodiment, the fuel gauge algorithms 220 can be stored in the storage medium 108 and are performed/executed by the controller 110.

Figure 3:
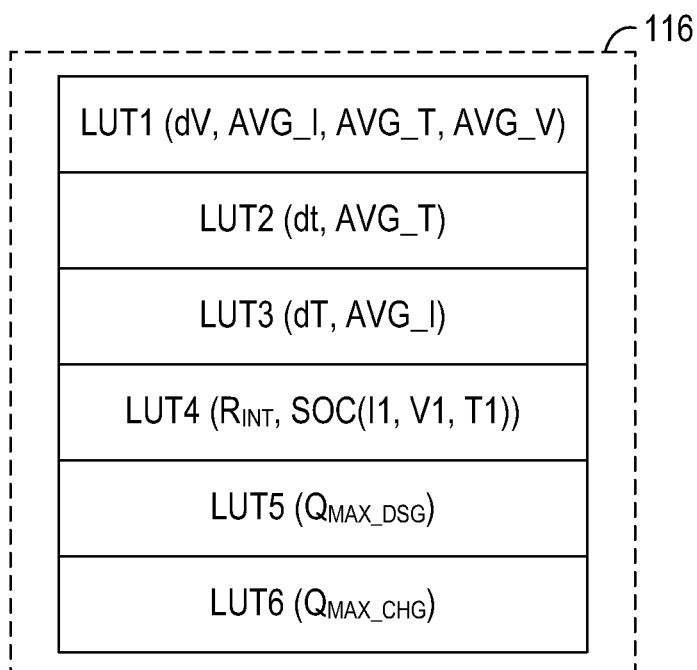
FIG. 3 illustrates examples of lookup tables stored in a memory, in an embodiment of the present invention.

FIG. 3 illustrates examples of the lookup tables 116, in an embodiment of the present invention. FIG. 3 is described in combination with FIG. 1 and FIG. 2. As shown in FIG. 3, the lookup tables 116 include a first lookup table LUT1, a second lookup table LUT2, a third lookup table LUT3, a fourth lookup table LUT4, a fifth lookup table LUT5, and a sixth lookup table LUT6. However, the invention is not limited to any particular number of lookup tables.

More specifically, in an embodiment, the first lookup table LUT1 can be referred to as a voltage-change lookup table, and can include multiple datasets related to battery voltage changes that are obtained in different time frames. Each dataset includes digital values of a battery voltage change dV, an average battery current AVG_I, an average battery temperature AVG_T, and an average battery voltage AVG_V. For example, the battery voltage of the battery 102 is V1 at time $t_A$, and V2 at time $t_B$. Thus, in the time frame from $t_A$ to $t_B$, the battery voltage change dV is given by: dV=|V2−V1|. An average level of the battery current can be obtained in many ways. For example, the average battery current AVG_I can be given by: AVG_I=(I1+I2)/2, where I1 and I2 represent the levels of the battery current at times $t_A$ and $t_B$, respectively. As another example, the average battery current AVG_I can be given by: AVG_I=(I1'+I2'+I3')/3, where I1', I2', and I3' represent the levels of the battery current at different times in the time frame from $t_A$ to $t_B$. As yet another example, the average battery current AVG_I can be given by: AVG_I=$[1/(t_B-t_A)]\int_{t_A}^{t_B} I_{BAT} dt$. The average battery temperature AVG_T and the average battery voltage AVG_V can be obtained in similar manners.

In an embodiment, the second lookup table LUT2 can be referred to as a time-length lookup table, and can include multiple datasets related to time lengths that are obtained in different time frames. Each dataset includes digital values of a time length dt and an average battery temperature AVG_T. In an embodiment, the time length dt is a length of time that it takes for the battery 102 to change from a close-to-fully-charged status to an end-of-charge status. For example, during a charging process, when the battery voltage increases to a certain level, the battery 102 enters a constant-voltage (CV) charging mode, and the battery current can decrease gradually. When the charging current decreases to a first preset level $I_{TCR}$, the battery 102 is considered to enter a close-to-fully-charged status, and the controller 110 starts a timer (not shown) to count time. In embodiments, the timer can be implemented by a hardware circuit and/or a software program. When the charging current decreases to a second preset level $I_{EOC}$ ($I_{EOC}<I_{TCR}$), the battery 102 is considered to enter an end-of-charge status, and the controller 110 measures how much time it has taken (e.g., the time length dt) based on the timer. The average battery temperature AVG_T can be obtained in a similar manner as described above in relation to the voltage-change lookup table LUT1.

In an embodiment, the third lookup table LUT3 can be referred to as a temperature-change lookup table, and can include multiple datasets related to temperature changes that are obtained in different time frames. Each dataset includes digital values of a battery temperature change dT and an average battery current AVG_I. For example, the temperature of the battery 102 is T1 at time $t_E$, and T2 at time $t_F$. Thus, in the time frame from $t_E$ to $t_F$, the battery temperature change dT is given by: dT=|T2−T1|. Additionally, the average battery current AVG_I can be obtained in a similar manner as described above in relation to the voltage-change lookup table LUT1.

In an embodiment, the fourth lookup table LUT4 can be referred to as a resistance lookup table, and can include multiple datasets related to battery internal resistances that are obtained in different time frames. Each dataset includes digital values of an internal resistance $R_{INT}$ and a state of charge SOC. The internal resistance $R_{INT}$ and state of charge SOC can be obtained based on the abovementioned fuel gauge algorithms.

In an embodiment, the fifth lookup table LUT5 and sixth lookup table LUT6 can be referred to as maximum-charge-capacity lookup tables. The fifth lookup table LUT5 can include a set of estimated values of a maximum charge capacity $Q_{MAX\_DSG}$ of the battery 102, estimated in different time frames when the battery 102 is discharging. The sixth lookup table LUT6 can include a set of digital values of a maximum charge capacity $Q_{MAX\_CHG}$ of the battery 102, estimated in different time frames when the battery 102 is being charged. Although FIG. 3 shows a fifth lookup table LUT5 and a sixth lookup table LUT6 as separate tables, the invention is not so limited. In another embodiment, the fifth lookup table LUT5 and the sixth lookup table LUT6 can be replaced by a seventh lookup table LUT7 (not shown). Each dataset in the seventh lookup table LUT7 includes a value of a maximum charge capacity $Q_{MAX}$ of the battery 102, and includes information indicative of whether the battery 102 is in a charging mode or in a discharging mode when the maximum charge capacity $Q_{MAX}$ is estimated. As used herein, the "maximum charge capacity" (e.g., $Q_{MAX\_CHG}$, $Q_{MAX\_DSG}$, or $Q_{MAX}$) refers to the maximum amount of charge that can be stored in a battery. In an embodiment, the maximum charge capacity of the battery 102 may decrease when the battery 102 has experienced multiple charging and discharging cycles. In each charging cycle or discharging cycle, the controller 100 can perform a fuel gauge algorithm to estimate the maximum charge capacity of the battery 102. The maximum charge capacity can be used to calculate a ratio of a remaining capacity of the battery to the maximum charge capacity, to estimate a state of charge of the battery.

Figure 4:
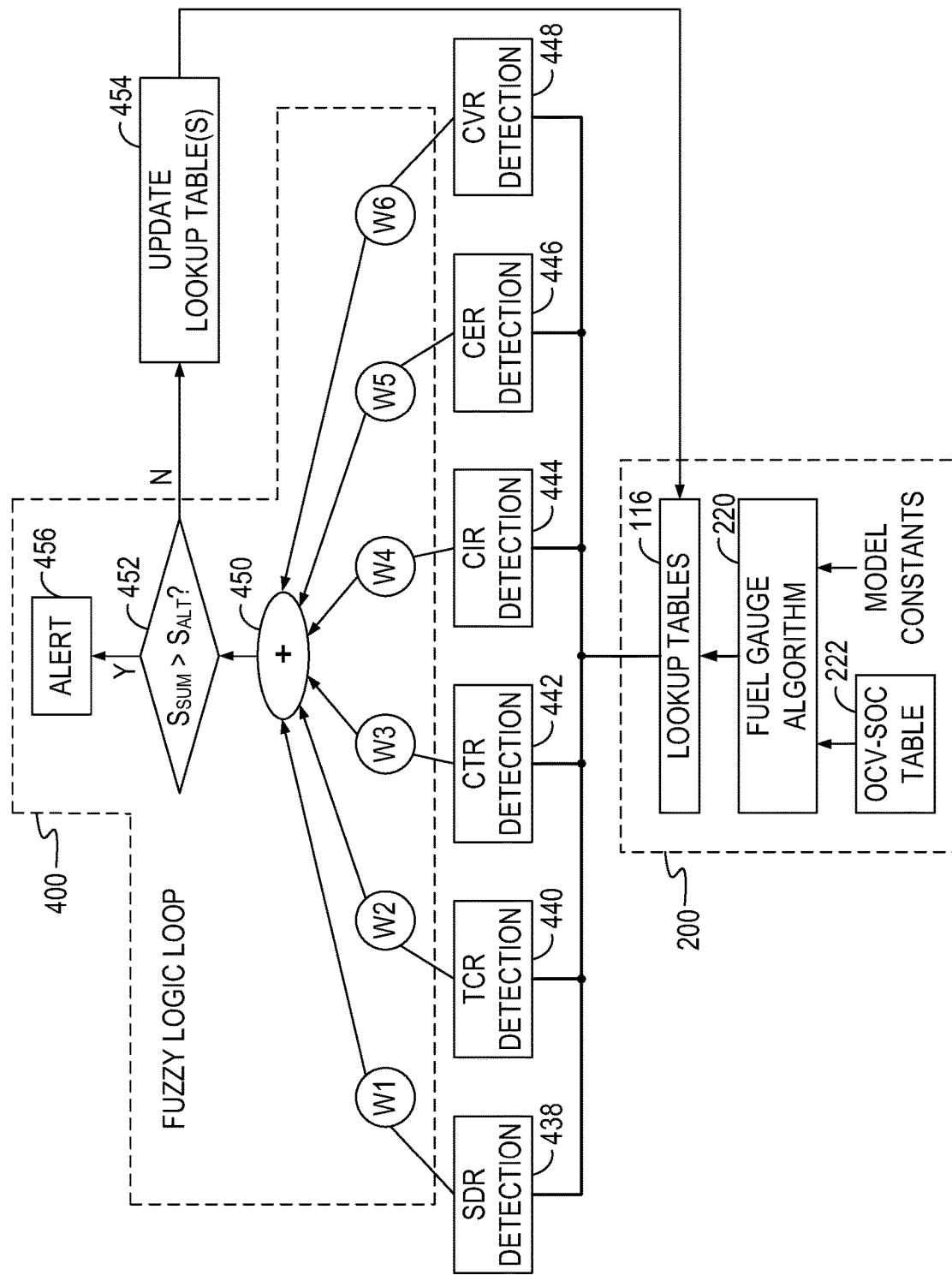
FIG. 4 illustrates an example of a software topology diagram for a fuzzy logic loop, in an embodiment of the present invention.

FIG. 4 illustrates an example of a software topology diagram for a fuzzy logic loop 400, in an embodiment of the present invention. FIG. 4 is described in combination with FIG. 1, FIG. 2, and FIG. 3. In the fuzzy logic loop 400, the controller 110 determines whether a potential fault (e.g., a potential internal short circuit) is present in the battery 102 based on a set of processes such as an SDR detection process 438, a TCR detection process 440, a CTR detection process 442, a CIR detection process 444, a CER detection process 446, and a CVR detection process 448. In each of these processes, the controller 110 obtains a current status of the battery 102, and compares the current status with a previous status of the battery 102 to determine whether a deviation of the current status from the previous status is in a predicted range. If the deviation is outside the predicted range and is within a predetermined threshold, then the controller 110 multiplies a parameter, indicative of the deviation, by a weighting factor (e.g., W1, W2, . . . , or W6) to generate a calculation result. Thus, a set of calculation results can be generated by performing the abovementioned processes. At 450, the controller 110 calculates a sum $S_{SUM}$ of the calculation results and, at 452, compares the sum $S_{SUM}$ with an alert threshold $S_{ALT}$. The alert threshold is a selected design value known to correlate with the presence of a potential fault, and is set high enough to avoid false indications of a potential fault but low enough to predict the presence of a potential fault. If the sum $S_{SUM}$ exceeds the alert threshold $S_{ALT}$, then the controller 110 determines that a potential fault is present in the battery 102 and issues an alert 456. If the sum $S_{SUM}$ does not exceed the alert threshold $S_{ALT}$, then the controller 110 performs a process 454 to update the lookup tables 116 based on the current status of the battery 102.

Figure 5:
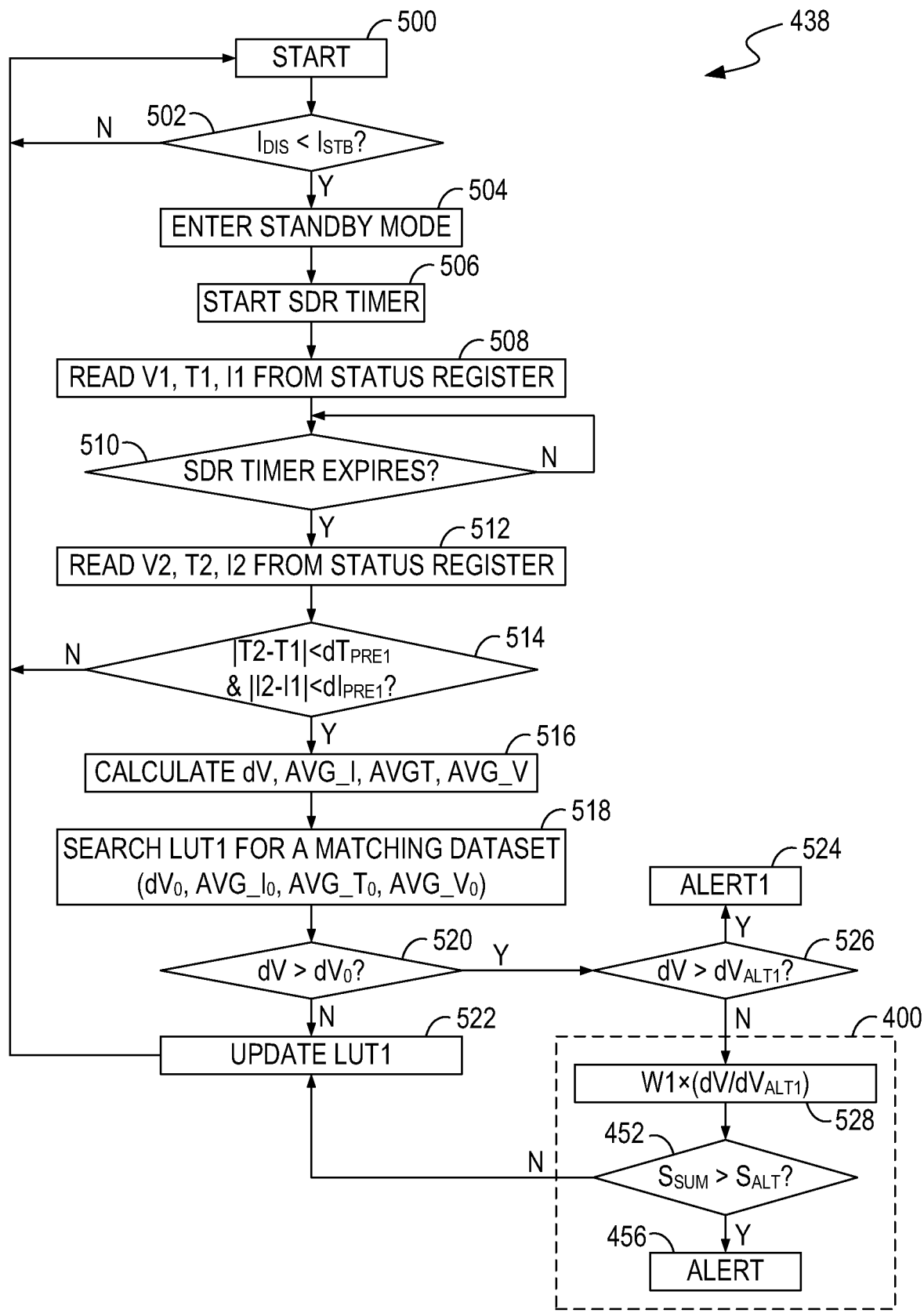
FIG. 5 illustrates an example of a method for detecting a potential fault in a battery, in an embodiment of the present invention.
Figure 6:
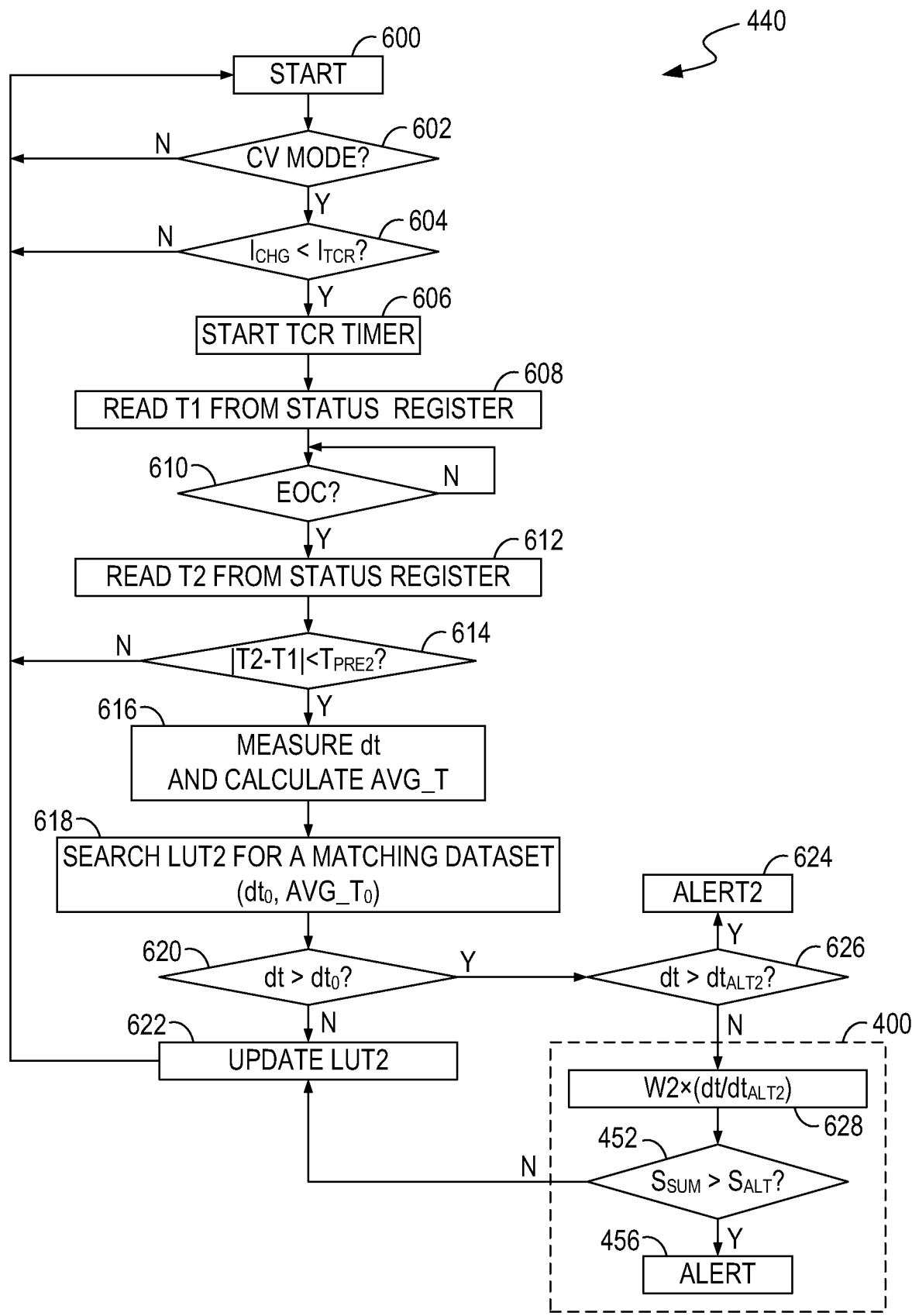
FIG. 6 illustrates an example of a method for detecting a potential fault in a battery, in an embodiment of the present invention.
Figure 7:
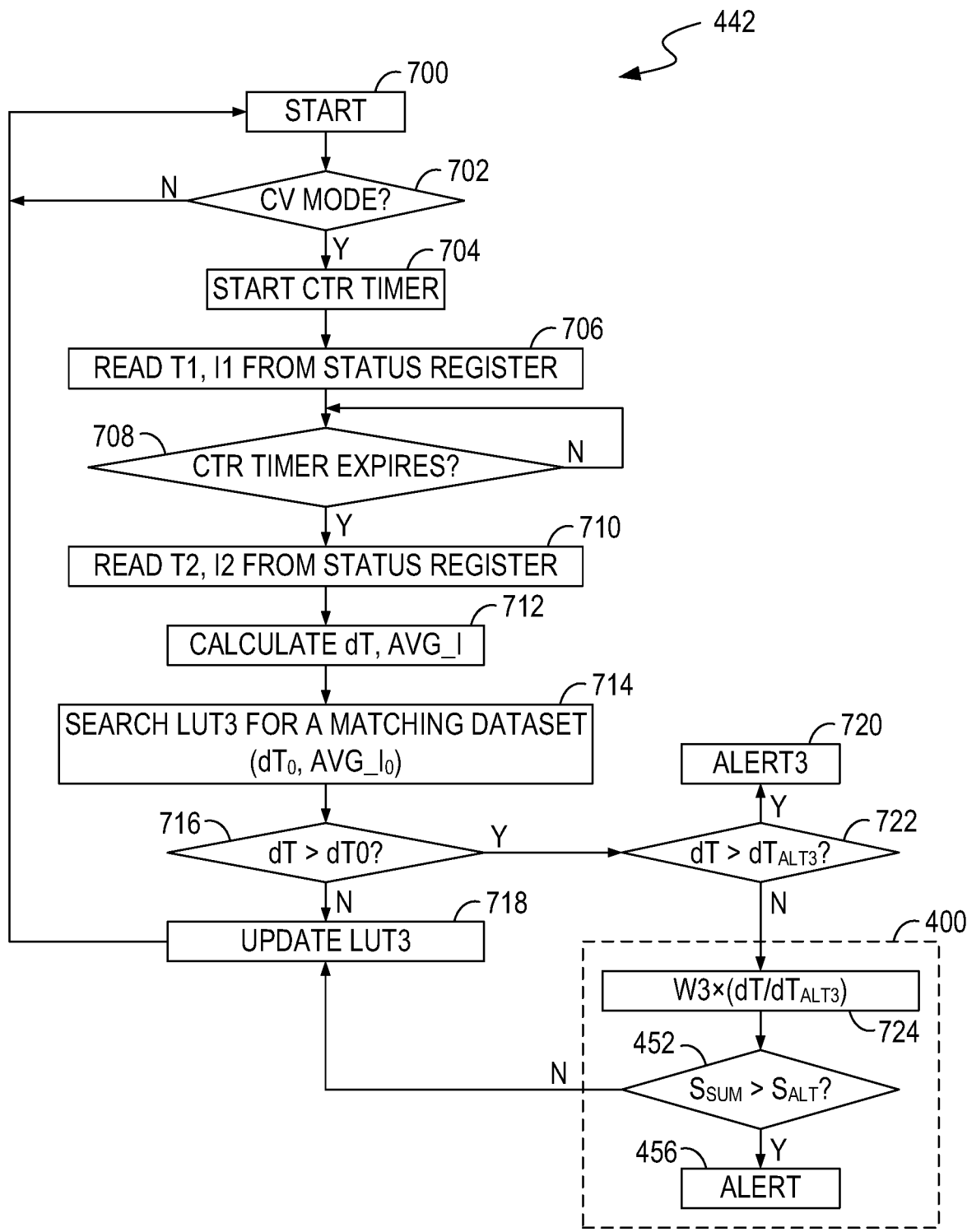
FIG. 7 illustrates an example of a method for detecting a potential fault in a battery, in an embodiment of the present invention.
Figure 8A:
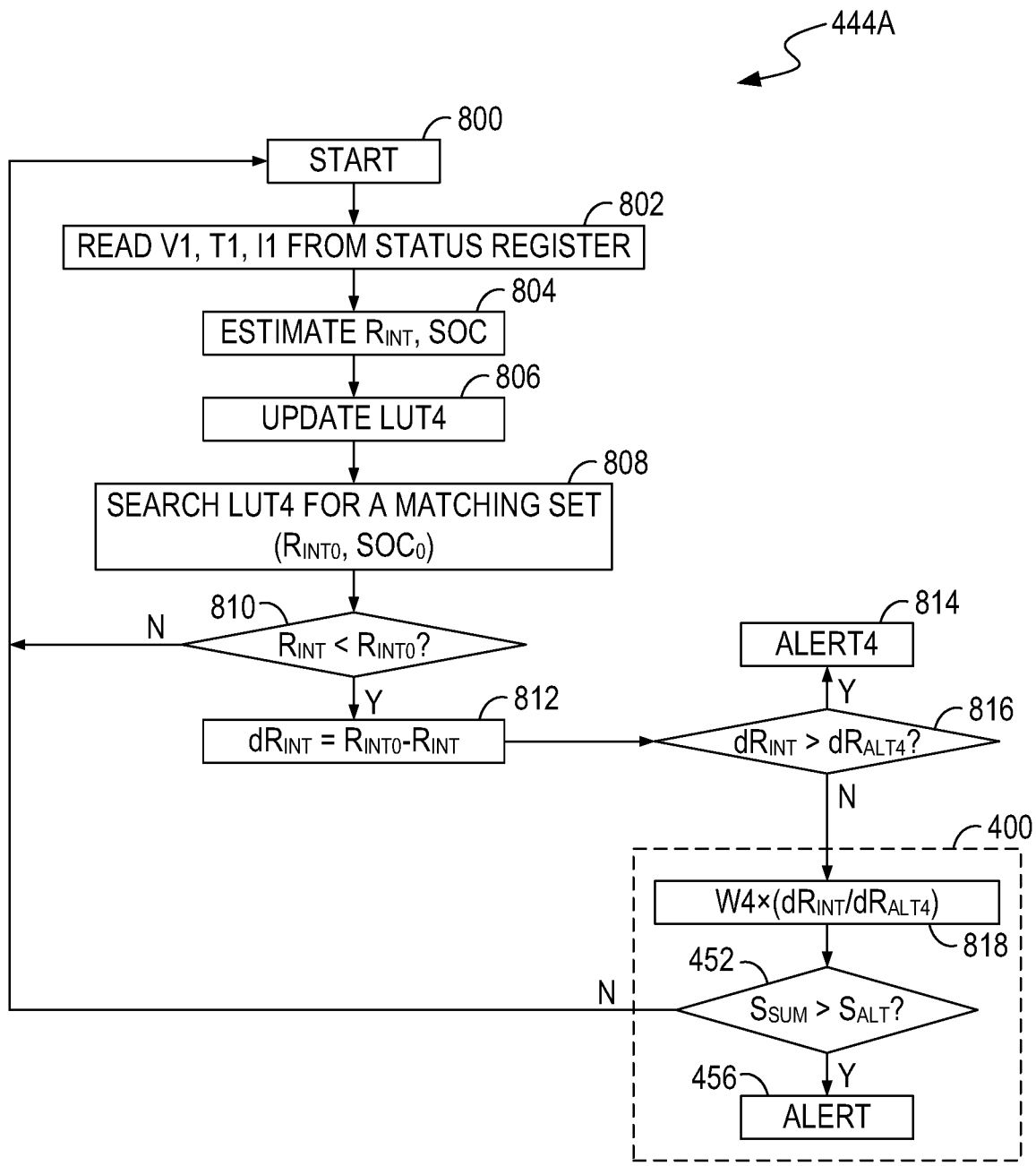
FIG. 8A illustrates an example of a method for detecting a potential fault in a battery, in an embodiment of the present invention.
Figure 8B:
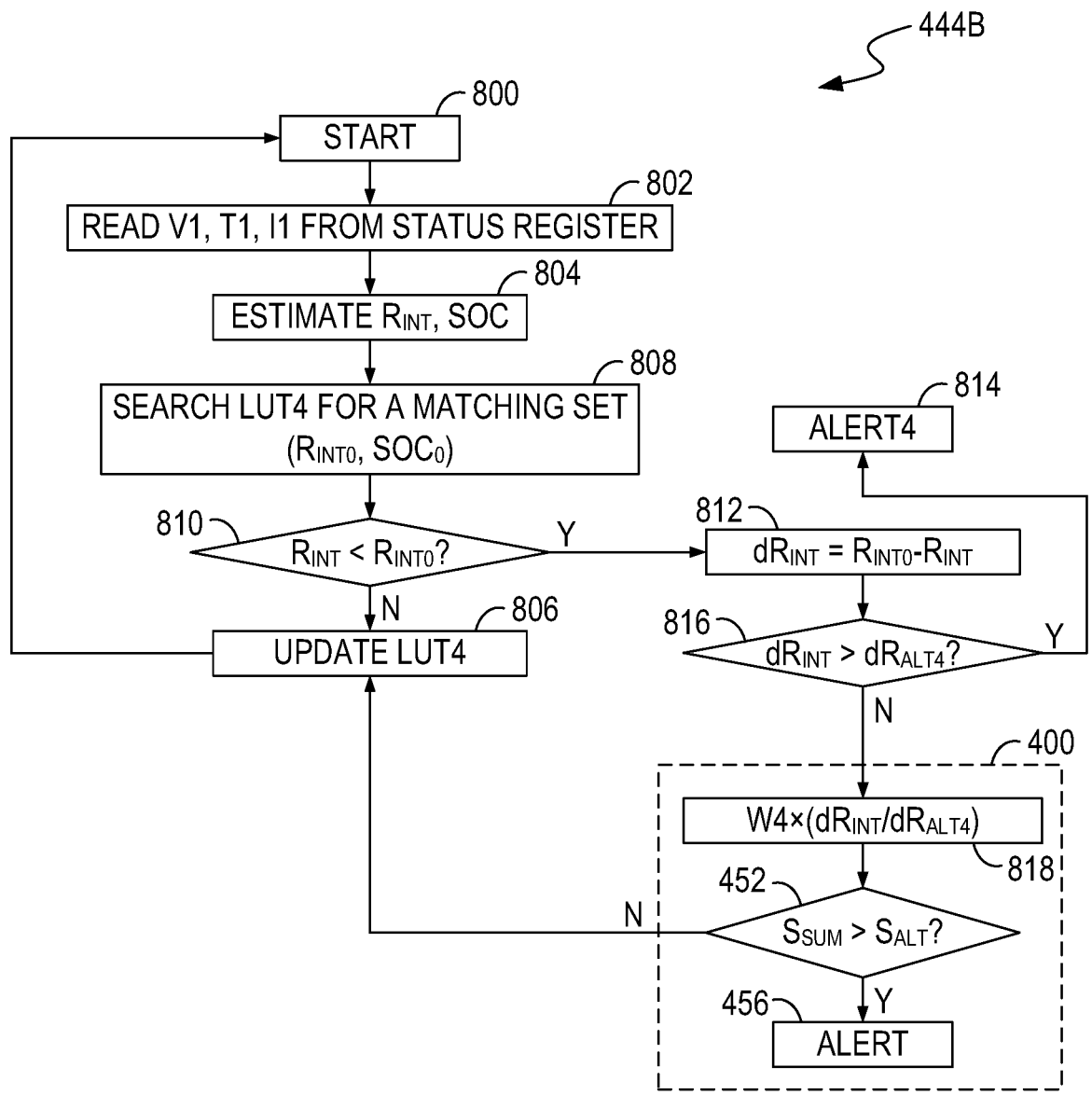
FIG. 8B illustrates an example of a method for detecting a potential fault in a battery, in an embodiment of the present invention.
Figure 9A:
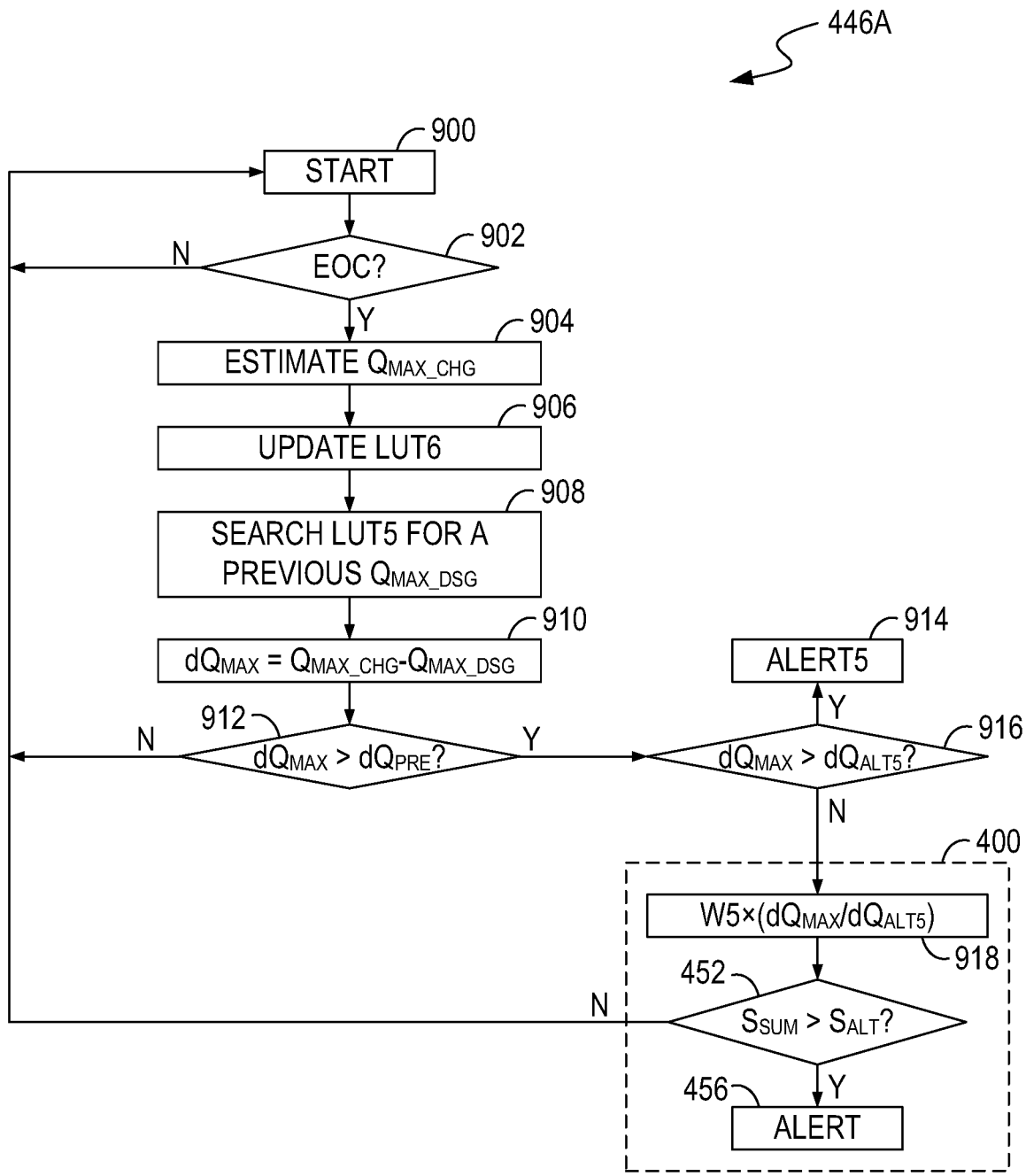
FIG. 9A illustrates an example of a method for detecting a potential fault in a battery, in an embodiment of the present invention.
Figure 9B:
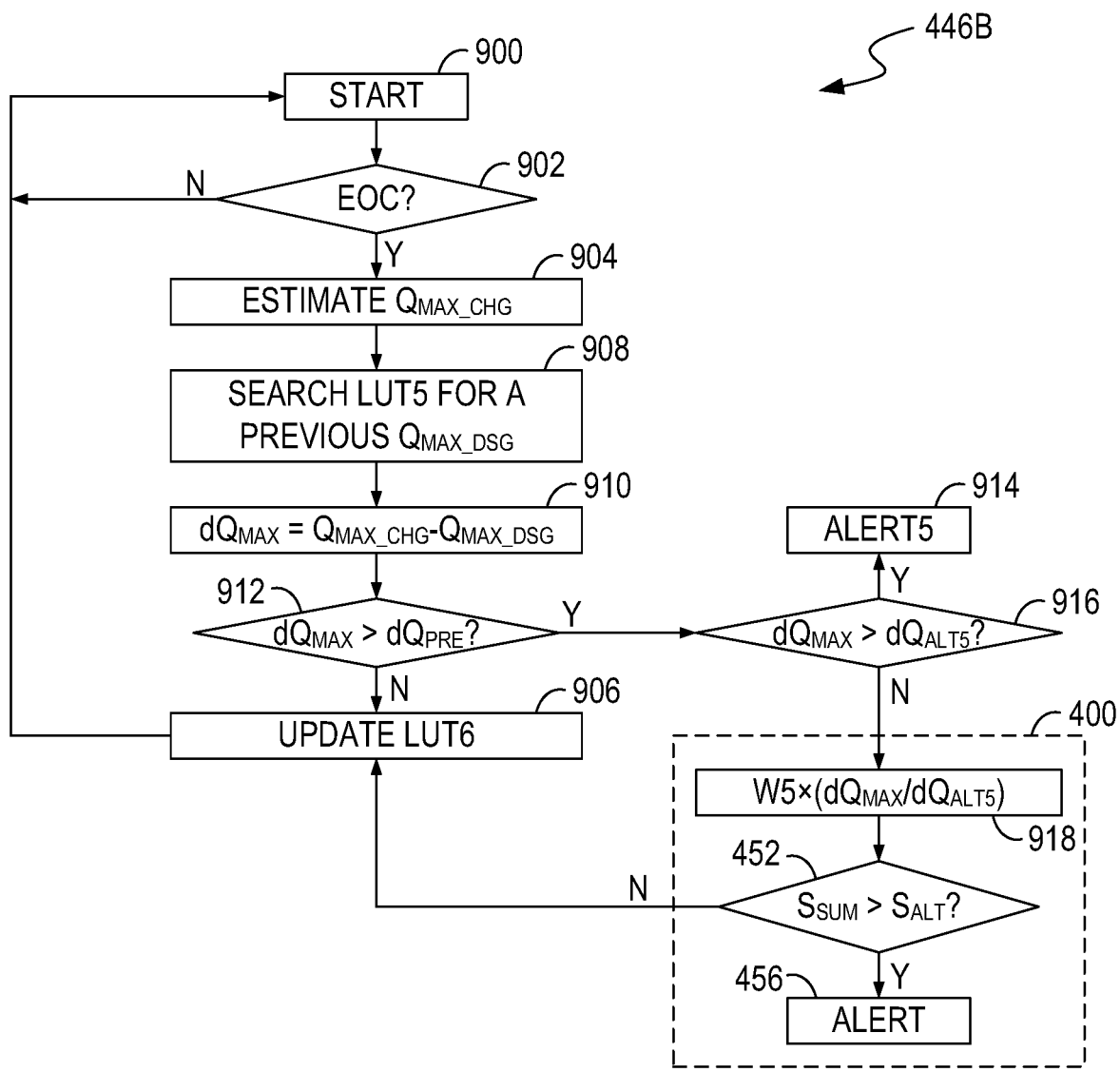
FIG. 9B illustrates an example of a method for detecting a potential fault in a battery, in an embodiment of the present invention.
Figure 10:
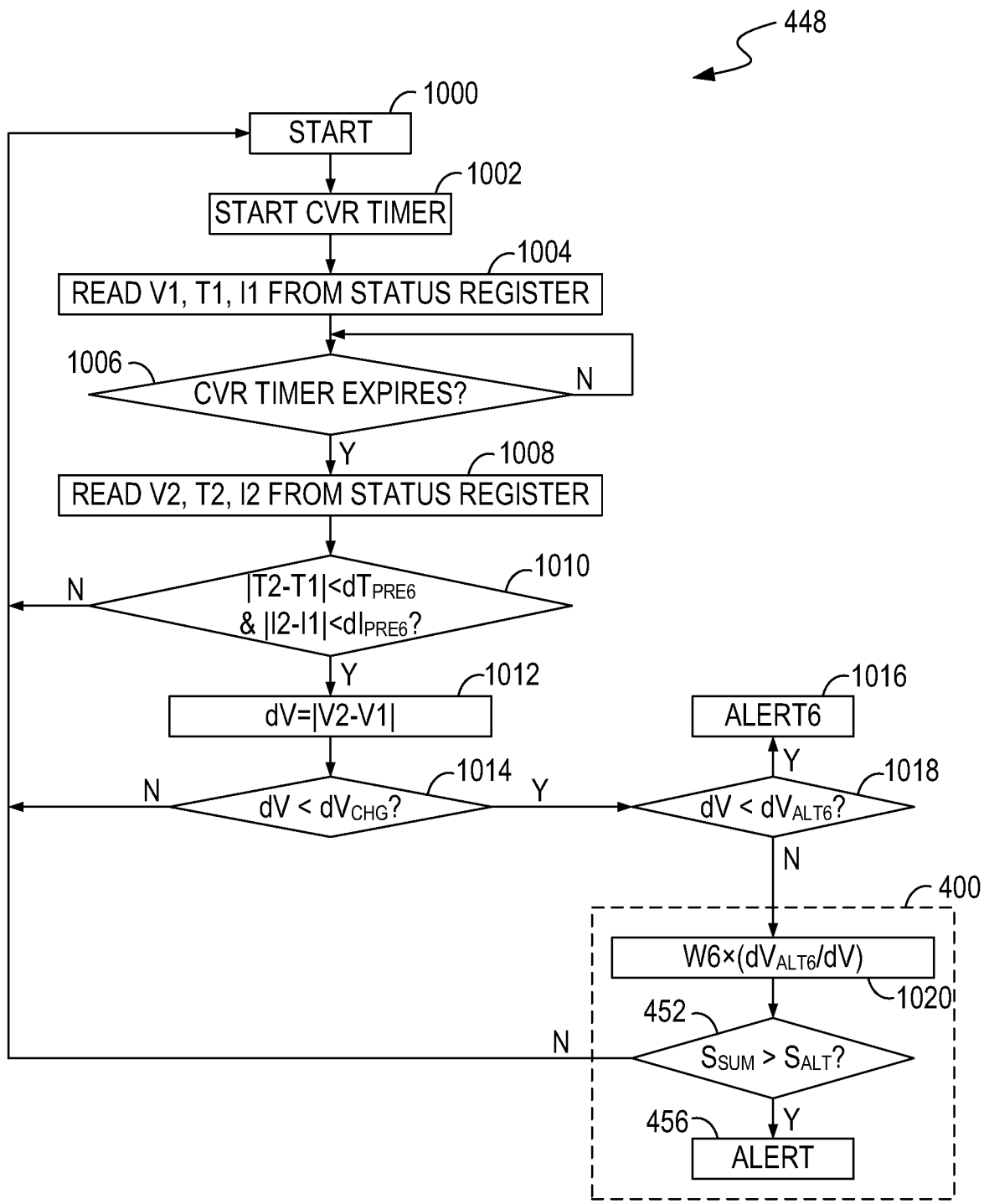
FIG. 10 illustrates an example of a method for detecting a potential fault in a battery, in an embodiment of the present invention.

More specifically, "SDR" can be referred to as self-discharge increase rate, and an example of a flowchart of the SDR detection process 438 is illustrated in FIG. 5. "TCR" can be referred to as taper current time increase rate (in constant-voltage (CV) mode), and an example of a flowchart of the TCR detection process 440 is illustrated in FIG. 6. "CTR" can be referred to as cell temperature increase rate (in CV mode), and an example of a flowchart of the CTR detection process 442 is illustrated in FIG. 7. "CIR" can be referred to as cell impedance decrease rate, and examples of flowcharts of the CTR detection process 444 are illustrated in FIG. 8A and FIG. 8B. "CER" can be referred to as cell charge/discharge efficiency drop rate, and examples of flowcharts of the CER detection process 446 are illustrated in FIG. 9A and FIG. 9B. "CVR" can be referred to as cell voltage variation rate, and an example of a flowchart of the CVR detection process 448 is illustrated in FIG. 10.

FIG. 5 illustrates an example of a flowchart of the SDR detection process 438, in an embodiment according to the present invention. In an embodiment, the SDR detection process 438 is performed based on the abovementioned voltage-change lookup table LUT1. Although specific steps are disclosed in FIG. 5, such steps are examples for illustrative purposes. That is, embodiments according to the present invention are well suited to performing various other steps or variations of the steps recited in FIG. 5. FIG. 5 is described in combination with FIG. 1, FIG. 2, FIG. 3 and FIG. 4.

As mentioned above, "SDR" can be referred to as self-discharge increase rate. The SDR detection process 438 can be performed when the battery 102 is in a standby mode. In the standby mode, the battery 102 can be self-discharged by a relatively small discharging current and a voltage of the battery 102 can decrease slowly. If the battery voltage's decrease rate (or self-discharge increase rate) is not within a predicted range, e.g., is greater than a reference value, then a potential fault may be present in the battery 102. In an embodiment, the reference value is obtained by searching the voltage-change lookup table LUT1. In an embodiment, the controller 110 can perform the SDR detection process 438 to predict the presence of a potential fault.

As shown in FIG. 5, at step 502, the controller 110 detects whether the battery pack 130 is in a standby mode. For example, the controller 110 obtains information for a discharging current $I_{DS}$ of the battery 102 from the data acquisition circuit 104 or reads that information from the abovementioned status register 124, and compares the discharging current $I_{DIS}$ with a reference current $I_{STB}$. The reference current is a design value known to correlate to the standby mode. If the discharging current $I_{DIS}$ is less than the reference current $I_{STB}$, then the controller 110 determines that the battery pack 130 is in a standby mode at step 504, and the flowchart 438 goes to step 506.

At step 506, at the beginning of a time frame (e.g., at time $t_A$), the controller 110 starts a timer (e.g., an SDR timer) to count time, and at step 508, the controller 110 reads a set of real-time values of a battery voltage V1, a battery temperature T1, and a battery current I1 from the status register 124. At step 510, when the predetermined length of the time frame expires, e.g., at time $t_B$, the controller 110 performs step 512 to read another set of real-time values of a battery voltage V2, a battery temperature T2, and a battery current I2 from the status register 124.

At step 514, the controller 110 determines whether the battery 102 is in a steady state. In an embodiment, if the battery 102 is not in a steady state, then the prediction of a potential fault in the battery 102 may be inaccurate. Thus, the controller 110 determines whether the battery 102 is in a steady state before performing the prediction process, to enhance accuracy. For example, at step 514, if the controller 110 detects that an absolute difference between the temperatures T1 and T2 is less than a temperature difference threshold $dT_{PRE1}$, and an absolute difference between the battery currents I1 and I2 is less than a current difference threshold $dI_{PRE1}$, then the controller 110 determines that the battery 102 is in a steady state, and the flowchart 438 goes to step 516; otherwise, the flowchart 438 returns to step 500. The temperature different threshold and the current difference threshold are selected design values known to correlate with the steady state condition.

At step 516, the controller 110 calculates a current voltage change dV (e.g., |V2−V1|) of the battery 102 in the current time frame (e.g., from $t_A$ to $t_B$). The controller 110 also calculates a current average current AVG_I (e.g., (I1+I2)/2), a current average temperature AVG_T (e.g., (T1+T2)/2), and a current average voltage AVG_V (e.g., (V1+V2)/2) of the battery 102 in the current time frame.

At step 518, the controller 110 searches the voltage-change lookup table LUT1 for a matching dataset ($dV_0$, $AVG\_I_0$, $AVG\_T_0$, $AVG\_V_0$). The matching dataset includes a matching average current $AVG\_I_0$, a matching average temperature $AVG\_T_0$, and a matching average voltage $AVG\_V_0$ that match or best match the current average current AVG_I, the current average temperature AVG_T, and the current average voltage AVG_V, respectively. As used herein, a first value (e.g., $AVG\_I_0$, $AVG\_T_0$, or $AVG\_V_0$) is defined as matching a second value (e.g., AVG_I, AVG_T, or AVG_V) when a difference between the first and second values is relatively small, e.g., less than a preset reference value that defines when the difference is small enough to be ignored. When the matching dataset is found, the controller 110 obtains/reads the previous voltage change $dV_0$ stored in the matching dataset. The controller 110 can then determine whether a potential fault is present in the battery 102 based on a comparison between the current voltage change dV and the previous voltage change $dV_0$. For example, the flowchart goes to step 520.

At step 520, the controller 110 compares the current voltage change dV with the previous voltage change $dV_0$ to determine whether the current voltage change dV is within a predicted range defined by the previous voltage change $dV_0$. That is, at this point in this example, the predicted range is equal to $dV_0$. If the current voltage change dV is less than the previous voltage change $dV_0$, then the current voltage change dV is considered to be within the predicted range, and the flowchart 438 goes to step 522. At step 522, the controller 110 updates the voltage-change lookup table LUT1 by, e.g., adding the values dV, AVG_I, AVG_T and AVG_V to the lookup table. If the current voltage change dV is greater than the previous voltage change $dV_0$, then the current voltage change dV is considered to be not within the predicted range, and therefore the controller 110 can then perform a prediction process to predict whether a potential fault is present in the battery 102. For example, the flowchart 438 goes to step 526.

At step 526, the controller 110 compares the current voltage change dV with a voltage change threshold $dV_{ALT1}$ ($dV_{ALT1} > dV_0$). The voltage change threshold is a selected design value known to correlate with the presence of a potential fault, and is set high enough to avoid false indications of a potential fault but low enough to predict the presence of a potential fault. If the current voltage change dV exceeds the voltage change threshold $dV_{ALT1}$, then the controller 110 determines that a potential fault is present in the battery 102, and the controller 110 performs step 524 to generate an alert signal. If the current voltage change dV is less than the voltage change threshold $dV_{ALT1}$, then the controller 110 performs the fuzzy logic loop 400 mentioned in relation to FIG. 4.

In the fuzzy logic loop 400, the controller 110 performs step 528 to calculate a ratio of the current voltage change dV to the voltage change threshold $dV_{ALT1}$, and then multiplies the ratio $dV/dV_{ALT1}$ by a first weighting factor W1 to generate a calculation result $W1 \times (dV/dV_{ALT1})$. The controller 110 predicts whether a potential fault is present in the battery 102 based on the calculation result $W1 \times (dV/dV_{ALT1})$. For example, at step 452, the controller 110 calculates a sum $S_{SUM}$ of a set of calculation results that include the result $W1 \times (dV/dV_{ALT1})$, and compares the sum $S_{SUM}$ with the abovementioned alert threshold $S_{ALT}$. If the sum $S_{SUM}$ exceeds the alert threshold $S_{ALT}$, then the controller 110 performs step 456 to generate an alert indicating that a potential fault is present in the battery 102.

FIG. 6 illustrates an example of a flowchart of the TCR detection process 440, in an embodiment according to the present invention. In an embodiment, the TCR detection process 440 is performed based on the abovementioned time-length lookup table LUT2. Although specific steps are disclosed in FIG. 6, such steps are examples for illustrative purposes. That is, embodiments according to the present invention are well suited to performing various other steps or variations of the steps recited in FIG. 6. FIG. 6 is described in combination with FIG. 1, FIG. 2, FIG. 3 and FIG. 4.

As mentioned above, "TCR" can be referred to as taper current time increase rate (in constant-voltage (CV) mode). The TCR detection process 440 can be performed when the battery 102 is in a CV charging mode. In the CV charging mode, the battery 102 is charged by a constant voltage, and the charging current decreases. The battery 102 can be charged until it is fully charged, e.g., the charging current decreases to an end-of-charge level. If the length of time it takes for the battery 102 to change from a close-to-fully-charged status to an end-of-charge status (or a fully-charged status) is not within a predicted range, e.g., longer than a reference value, then a potential fault may be present in the battery 102. In an embodiment, the reference value is obtained by searching the time-length lookup table LUT2. In an embodiment, the controller 110 can perform the TCR detection process 440 to predict the presence of a potential fault.

As shown in FIG. 6, at step 602, the controller 110 detects whether the battery pack 130 is in a CV charging mode. In an embodiment, when a battery voltage of the battery 102 increases to a level that is within a specified range of a fully-charged voltage of the battery 102, the battery 102 enters a CV charging mode and is charged by a constant voltage. If the battery 102 is in the CV charging mode, then the flowchart 440 goes to step 604.

At step 604, the controller 110 obtains information for a charging current $I_{CHG}$ of the battery 102 from the data acquisition circuit 104 or reads the information from the abovementioned status register 124, and compares the charging current $I_{CHG}$ with a reference current $I_{TCR}$. If the charging current $I_{CHG}$ is less than the reference current $I_{TCR}$, then the battery 102 is considered to enter a close-to-fully-charged status, and the flowchart 440 goes to step 606. The reference current is a design value known to correlate with the fully-charged status.

At step 606, at the beginning of a time frame (e.g., at time $t_C$), the controller 110 starts a timer (e.g., a TCR timer) to count time, and at step 608, the controller 110 reads a real-time value of a battery temperature T1 from the status register 124. At step 610, the controller 110 waits for the battery 102 to enter an end-of-charge (EOC) status, e.g., the controller waits for the charging current $I_{CHG}$ to decrease to an end-of-charge current reference $I_{EOC}$ ($I_{EOC} < I_{TCR}$), which is a design value known to correlate to the EOC status. When the battery 102 enters the EOC status (e.g., at time $t_D$), the controller 102 performs step 612 to read another real-time value of a battery temperature T2 from the status register 124.

At step 614, the controller 110 determines whether the battery temperature is in a steady state by comparing an absolute difference between the temperatures T1 and T2 with a temperature difference threshold $dT_{PRE2}$ that is a design value known to correlate to a steady state condition. If the absolute difference |T2−T1| is less than the temperature difference threshold $dT_{PRE2}$, then the battery temperature is considered to be in a steady state, and the flowchart 440 goes to step 616.

At step 616, the controller 110 measures a current time length dt that it takes for the battery 102 to change from the close-to-fully-charged status to the end-of-charge status in a current time frame (e.g., from $t_C$ to $t_D$), and calculates a current average temperature AVG_T of the battery 102 in the current time frame. For example, the current time length dt can be given by: $dt = t_D - t_C$, and the current average temperature AVG_T can be given by: $AVG\_T = (T1+T2)/2$.

At step 618, the controller 110 searches the time-length lookup table LUT2 for a matching dataset ($dt_0$, $AVG\_T_0$). The matching dataset includes a matching average temperature $AVG\_T_0$ that matches or best matches the current average temperature AVG_T. That is, for example, a matching dataset is found when a difference between the temperatures AVG_T and $AVG\_T_0$ is relatively small, e.g., less than a preset reference value that defines when the difference is small enough to be ignored. When the matching dataset is found, the controller 110 obtains/reads the previous time length $dt_0$ stored in the matching dataset. The controller 110 determines whether a potential fault is present in the battery 110 based on a comparison between the current time length dt and the previous time length $dt_0$. For example, the flowchart goes to step 620.

At step 620, the controller 110 compares the current time length dt with the previous time length $dt_0$ to determine whether the current time length dt is within a predicted range defined by the previous time length $dt_0$. That is, at this point in this example, the predicted range is equal to $dt_0$. If the current time length dt is less than the previous time length $dt_0$, then the current time length dt is considered to be within the predicted range, and the flowchart 440 goes to step 622. At step 622, the controller 110 updates the time-length lookup table LUT2 by, e.g., adding the values dt and AVG_T to the lookup table. If the current time length dt is greater than the previous time length $dt_0$, then the current time length dt is considered to be not within the predicted range, and therefore the controller 110 performs a prediction process to predict whether a potential fault is present in the battery 102. For example, the flowchart 440 goes to step 626.

At step 626, the controller 110 compares the current time length dt with a time length threshold $dt_{ALT2}$ ($dt_{ALT2}>dt_0$). The time length threshold is a selected design value known to correlate with the presence of a potential fault, and is set high enough to avoid false indications of a potential fault but low enough to predict the presence of a potential fault. If the current time length dt exceeds the time length threshold $dt_{ALT2}$, then the controller 110 determines that a potential fault is present in the battery 102, and the controller 110 performs step 624 to generate an alert signal. If the current time length dt is less than the time length threshold $dt_{ALT2}$, then the controller 110 performs the fuzzy logic loop 400.

In the fuzzy logic loop 400, the controller 110 performs step 628 to calculate a ratio of the current time length dt to the time length threshold $dt_{ALT2}$, and multiplies the ratio $dt/dt_{ALT2}$ by a second weighting factor W2 to generate a calculation result $W2 \times (dt/dt_{ALT2})$. The controller 110 predicts whether a potential fault is present in the battery 102 based on the calculation result $W2 \times (dt/dt_{ALT2})$. For example, at step 452, the controller 110 calculates a sum $S_{SUM}$ of a set of calculation results that include the result $W2 \times (dt/dt_{ALT2})$, and compares the sum $S_{SUM}$ with the alert threshold $S_{ALT}$. If the sum $S_{SUM}$ exceeds the alert threshold $S_{ALT}$, then the controller 110 performs step 456 to generate an alert indicating that a potential fault is present in the battery 102.

FIG. 7 illustrates an example of a flowchart of the CTR detection process 442, in an embodiment according to the present invention. In an embodiment, the CTR detection process 442 is performed based on the abovementioned temperature-change lookup table LUT3. Although specific steps are disclosed in FIG. 7, such steps are examples for illustrative purposes. That is, embodiments according to the present invention are well suited to performing various other steps or variations of the steps recited in FIG. 7. FIG. 7 is described in combination with FIG. 1, FIG. 2, FIG. 3 and FIG. 4.

As mentioned above, "CTR" can be referred to as cell temperature increase rate (in CV mode). The CTR detection process 442 can be performed when the battery 102 is in a CV charging mode. In the CV charging mode, the battery 102 is charged by a constant voltage, and the charging current decreases gradually. Thus, the battery temperature is relatively stable. If the battery temperature increases and the increase rate is not within a predicted range, e.g., is greater than a reference value, then a potential fault may be presented in the battery 102. In an embodiment, the reference value is obtained by searching the temperature-change lookup table LUT3. In an embodiment, the controller 110 can perform the CTR detection process 442 to predict the presence of a potential fault.

As shown in FIG. 7, at step 702, the controller 110 detects whether the battery pack 130 is in a CV charging mode. If the battery 102 is in a CV charging mode, then the flowchart 442 goes to step 704.

At step 704, at the beginning of a time frame (e.g., at time $t_E$), the controller 110 starts a timer (e.g., a CTR timer) to count time, and at step 706, the controller 110 reads a set of real-time values of a battery temperature T1 and a battery current I1 from the status register 124.

At step 708, when a predetermined length of a time frame expires (e.g., at time $t_F$), the controller 110 performs step 710 to read another set of real-time values of a battery temperature T2 and a battery current I2 from the status register 124.

At step 712, the controller 110 calculates a current temperature change dT (e.g., T2−T1), of the battery 102 in the current time frame, e.g., from $t_E$ to $t_F$. The controller 110 also calculates a current average current AVG_I, e.g., (I1+I2)/2, of the battery 102 in the current time frame.

At step 714, the controller 110 searches the temperature-change lookup table LUT3 for a matching dataset ($dT_0$, $AVG\_I_0$). The matching dataset includes a matching average current $AVG\_I_0$ that matches or best matches the current average current $AVG\_I$. For example, a matching dataset is found when a difference between the currents AVG_I and $AVG\_I_0$ is relatively small, e.g., less than a preset reference value that defines when the difference is small enough to be ignored. When the matching dataset is found, the controller 110 obtains/reads the previous temperature change $dT_0$ stored in the matching dataset. The controller 110 determines whether a potential fault is present in the battery 102 based on a comparison between the current temperature change dT and the previous temperature change $dT_0$. For example, the flowchart goes to step 716.

At step 716, the controller 110 compares the current temperature change dT with the previous temperature change $dT_0$ to determine whether the current temperature change dT is within a predicted range defined by the previous temperature change $dT_0$. That is, at this point in this example, the predicted range is equal to $dT_0$. If the current temperature change dT is less than the previous temperature change $dT_0$, then the current temperature change dT is considered to be within the predicted range, and the flowchart 438 goes to step 718. At step 718, the controller 110 updates the temperature-change lookup table LUT3 by, e.g., adding the values dT and AVG_I to the lookup table. If the current temperature change dT is greater than the previous temperature change $dT_0$, then the current temperature change dT is considered to be not within the predicted range, and therefore the controller 110 performs a prediction process to predict whether a potential fault is present in the battery 102. For example, the flowchart 442 goes to step 722.

At step 722, the controller 110 compares the current temperature change dT with a temperature change threshold $dT_{ALT3}$ ($dT_{ALT3}>dT_0$). The temperature change threshold is a selected design value known to correlate with the presence of a potential fault, and is set high enough to avoid false indications of a potential fault but low enough to predict the presence of a potential fault. If the current temperature change dT exceeds the temperature change threshold $dT_{ALT3}$, then the controller 110 determines that a potential fault is present in the battery 102, and the controller 110 performs step 720 to generate an alert signal. If the current temperature change dT is less than the temperature change threshold $dT_{ALT3}$, then the controller 110 performs the fuzzy logic loop 400.

In the fuzzy logic loop 400, the controller 110 performs step 724 to calculate a ratio of the current temperature change dT to the temperature change threshold $dT_{ALT3}$, and multiplies the ratio $dT/dT_{ALT3}$ by a third weighting factor W3 to generate a calculation result $W3 \times (dT/dT_{ALT3})$. The controller 110 predicts whether a potential fault is present in the battery 102 based on the calculation result $W3 \times (dT/dT_{ALT1})$. For example, at step 452, the controller 110 calculates a sum $S_{SUM}$ of a set of calculation results that include the result $W3 \times (dT/dT_{ALT1})$, and compares the sum $S_{SUM}$ with the alert threshold $S_{ALT}$. If the sum $S_{SUM}$ exceeds the alert threshold $S_{ALT}$, then the controller 110 performs step 456 to generate an alert indicating that a potential fault is present in the battery 102.

FIG. 8A illustrates an example of a flowchart 444A of the CIR detection process 444, in an embodiment according to the present invention. In an embodiment, the CIR detection process 444 is performed based on the abovementioned resistance lookup table LUT4. Although specific steps are disclosed in FIG. 8A, such steps are examples for illustrative purposes. That is, embodiments according to the present invention are well suited to performing various other steps or variations of the steps recited in FIG. 8A. FIG. 8A is described in combination with FIG. 1, FIG. 2, FIG. 3 and FIG. 4.

As mentioned above, "CIR" can be referred to as cell impedance decrease rate. In an embodiment, a rechargeable battery such as a lithium-ion battery, e.g., the battery 102, includes an internal resistance $R_{INT}$ dependent on DOD (depth of discharge). The internal resistance $R_{INT}$ is related to a depth of discharge or a state of charge of the battery 102. In other words, if the battery 102 is in a healthy state, then the internal resistance $R_{INT}$ will have a value in a predicted range associated with the state of charge of the battery 102. The predicted range can be determined by a reference value that is obtained by searching the resistance lookup table LUT4. If the internal resistance $R_{INT}$ is not within the predicted range, e.g., less than the reference value, then a potential fault may be present in the battery 102. In an embodiment, the controller 110 can perform the CIR detection process 444 to predict the presence of a potential fault.

As shown in FIG. 8A, at step 802, the controller 110 reads a set of real-time values of a battery voltage V1, a battery temperature T1, and a battery current I1 from the status register 124.

At step 804, the controller 110 performs/executes the abovementioned fuel algorithms 220 to estimate/obtain a current internal resistance $R_{INT}$ of the battery 102 in a current time frame, e.g., at a current point in time, and estimates/obtains a current state of charge SOC of the battery 102 in the current time frame, based on the battery voltage V1, the battery temperature T1, and the battery current I1.

At step 806, the controller 110 updates the resistance lookup table LUT4 by, e.g., adding the values $R_{INT}$ and SOC to the lookup table.

At step 808, the controller 110 searches the resistance lookup table LUT4 for a matching dataset $(R_{INT0}, SOC_0)$. The matching dataset includes a matching state of charge $SOC_0$ that matches or best matches the current state of charge SOC. For example, a matching dataset is found when a difference between the current state of charge SOC and the previous state of charge $SOC_0$ is relatively small, e.g., less than a preset reference value that defines when the difference is small enough to be ignored. When the matching dataset is found, the controller 110 obtains/reads the previous internal resistance $R_{INT0}$ stored in the matching dataset. The controller 110 determines whether a potential fault is present in the battery 102 based on a difference between the current internal resistance $R_{INT}$ and the previous internal resistance $R_{INT0}$. For example, the flowchart goes to step 810.

At step 810, the controller 110 compares the current internal resistance $R_{INT}$ with the previous internal resistance $R_{INT0}$ to determine whether the current internal resistance $R_{INT}$ is within a predicted range defined by the previous internal resistance $R_{INT0}$. That is, at this point in this example, the predicted range is equal to $R_{INT0}$. If the current internal resistance $R_{INT}$ is greater than the previous internal resistance $R_{INT0}$, then the current internal resistance $R_{INT}$ is considered to be within the predicted range, and the flowchart 444A goes to step 800. If the current internal resistance $R_{INT}$ is less than the previous internal resistance $R_{INT0}$, then the current internal resistance $R_{INT}$ is considered to be not within the predicted range, and therefore the controller 110 performs a prediction process to predict whether a potential fault is present in the battery 102. For example, the flowchart 444A goes to step 812.

At step 812, the controller 110 calculates a resistance difference $dR_{INT}$ between the current internal resistance $R_{INT}$ and the previous internal resistance $R_{INT0}$, e.g., $dR_{INT}=R_{INT0}-R_{INT}$.

At step 816, the controller 110 compares the resistance difference $dR_{INT}$ with a resistance difference threshold $dR_{ALT4}$. The resistance difference threshold is a selected design value known to correlate with the presence of a potential fault, and is set high enough to avoid false indications of a potential fault but low enough to predict the presence of a potential fault. If the resistance difference $dR_{INT}$ exceeds the resistance difference threshold $dR_{ALT4}$, then the controller 110 determines that a potential fault is present in the battery 102, and the controller 110 performs step 814 to generate an alert signal. If the resistance difference $dR_T$ is less than the resistance difference threshold $dR_{ALT4}$, then the controller 110 performs the fuzzy logic loop 400.

In the fuzzy logic loop 400, the controller 110 performs step 818 to calculate a ratio of the resistance difference $dR_{INT}$ to the resistance difference threshold $dR_{ALT4}$, and multiplies the ratio $dR_{INT}/dR_{ALT4}$ by a fourth weighting factor W4 to generate a calculation result $W4\times(dR_{INT}/dR_{ALT4})$. The controller 110 predicts whether a potential fault is presented in the battery 102 based on the calculation result $W4\times(dR_{INT}/dR_{ALT4})$. For example, at step 452, the controller 110 calculates a sum $S_{SUM}$ of a set of calculation results that include the result $W4\times(dR_{INT}/dR_{ALT4})$, and compares the sum $S_{SUM}$ with the alert threshold $S_{ALT}$. If the sum $S_{SUM}$ exceeds the alert threshold $S_{ALT}$, then the controller 110 performs step 456 to generate an alert indicating that a potential fault is presented in the battery 102.

FIG. 8B illustrates another example of a flowchart 444B of the CIR detection process 444, in an embodiment according to the present invention. Although specific steps are disclosed in FIG. 8B, such steps are examples for illustrative purposes. That is, embodiments according to the present invention are well suited to performing various other steps or variations of the steps recited in FIG. 8B. FIG. 8B is described in combination with FIG. 1, FIG. 2, FIG. 3, FIG. 4 and FIG. 8A.

In an embodiment, the flowchart 444B in FIG. 8B is similar to the flowchart 444A in FIG. 8A except that in the flowchart 444B, the controller 110 performs the step 806 after the step 810 or after the step 452. More specifically, in the example of FIG. 8B, the controller 110 updates the resistance lookup table LUT4 after determining that the current internal resistance $R_{INT}$ is within the predicted range, e.g., $R_{INT}>R_{INT0}$, or after determining that no potential fault is detected in the battery 102.

FIG. 9A illustrates an example of a flowchart 446A of the CER detection process 446, in an embodiment according to the present invention. In an embodiment, the CER detection process 446 is performed based on the abovementioned maximum-charge-capacity lookup tables LUT5, LUT6, and/or LUT7. Although specific steps are disclosed in FIG. 9A, such steps are examples for illustrative purposes. That is, embodiments according to the present invention are well suited to performing various other steps or variations of the steps recited in FIG. 9A. FIG. 9A is described in combination with FIG. 1, FIG. 2, FIG. 3 and FIG. 4.

As mentioned above, "CER" can be referred to as cell charge/discharge efficiency drop rate. In an embodiment, a maximum charge capacity of the battery 102 can decrease when the battery 102 has experienced multiple charging and discharging cycles. If a decrease rate of the maximum charge capacity is not within a predicted range, e.g., greater than a reference value, then a potential fault may be presented in the battery 102. In an embodiment, the reference value is obtained by searching the maximum-charge-capacity lookup table LUT5, LUT6 or LUT7. In an embodiment, the controller 110 can perform the CER detection process 446 to predict the presence of a potential fault.

In an embodiment, the CER detection process 446 is performed when the battery 102 is in a charging mode. As shown in FIG. 9A, at step 902, the controller 110 determines whether the battery 102 enters an end-of-charge state in a current charging cycle. In an embodiment, if a charging current $I_{CHG}$ of the battery 102 is less than an end-of-charge reference current $I_{EOC}$ that is known to correlate to an end-of-charge state, then the battery 102 is considered to enter an end-of-charge state.

When the battery 102 enters the end-of-charge state, the controller 110 performs step 904 to estimate a current maximum charge capacity $Q_{MAX\_CHG}$ of the battery 102.

At step 906, the controller 110 updates the maximum-charge-capacity lookup table LUT6 (or LUT7) by, e.g., adding the value $Q_{MAX\_CHG}$ to the lookup table.

At step 908, the controller 110 obtains a previous maximum charge capacity $Q_{MAX\_DSG}$ of the battery 102, estimated in a previous discharging cycle, from the maximum-charge-capacity lookup table LUT5 (or LUT7). The controller 110 can determine whether a potential fault is present in the battery 102 based on a difference between the current maximum charge capacity $Q_{MAX\_CHG}$ and the previous maximum charge capacity $Q_{MAX\_DSG}$. For example, the flowchart 446A goes to step 910.

At step 910, the controller 110 calculates a capacity difference $dQ_{MAX}$ between the maximum charge capacity $Q_{MAX\_CHG}$ estimated in the current charging cycle and the maximum charge capacity $Q_{MAX\_DHG}$ estimated in the previous discharging cycle.

At step 912, the controller 110 determines whether the currently estimated maximum charge capacity $Q_{MAX\_CHG}$ is within a predicted range by, e.g., comparing the capacity difference $dQ_{MAX}$ with a capacity difference reference $dQ_{PRE}$. That is, at this point in this example, the predicted range is equal to $Q_{MAX\_DSG}$. If the capacity difference $dQ_{MAX}$ is less than the capacity difference reference $dQ_{PRE}$ (e.g., indicating that the $Q_{MAX\_CHG}$ is approximately equal to $Q_{MAX\_DSG}$), then the current maximum charge capacity $Q_{MAX\_CHG}$ is considered to be within the predicted range, and the flowchart 446A goes to step 900. If the capacity difference $dQ_{MAX}$ is greater than the capacity difference reference $dQ_{PRE}$, then the current maximum charge capacity $Q_{MAX\_CHG}$ is considered to be not within the predicted range, and therefore the controller 110 performs a prediction process to predict whether a potential fault is presented in the battery 102. For example, the flowchart 446A goes to step 916.

At step 916, the controller 110 compares the capacity difference $dQ_{MAX}$ with a capacity difference threshold $dQ_{ALT5}$ ($dQ_{ALT5} > dQ_{PRE}$). The capacity difference threshold is a selected design value known to correlate with the presence of a potential fault, and is set high enough to avoid false indications of a potential fault but low enough to predict the presence of a potential fault. If the capacity difference $dQ_{MAX}$ exceeds the capacity difference threshold $dQ_{ALT5}$, then the controller 110 determines that a potential fault is present in the battery 102, and the controller 110 performs step 914 to generate an alert signal. If the capacity difference $dQ_{MAX}$ is less than the capacity difference threshold $dQ_{ALT5}$, then the controller 110 performs the fuzzy logic loop 400.

In the fuzzy logic loop 400, the controller 110 performs step 918 to calculate a ratio of the capacity difference $dQ_{MAX}$ to the capacity difference threshold $dQ_{ALT5}$, and multiplies the ratio $dQ_{MAX}/dQ_{ALT5}$ by a fifth weighting factor W5 to generate a calculation result $W5 \times (dQ_{MAX}/dQ_{ALT5})$. The controller 110 predicts whether a potential fault is presented in the battery 102 based on the calculation result $W5 \times (dQ_{MAX}/dQ_{ALT})$. For example, at step 452, the controller 110 calculates a sum $S_{SUM}$ of a set of calculation results that include the result $W5 \times (dQ_{MAX}/dQ_{ALT5})$, and compares the sum $S_{SUM}$ with the alert threshold $S_{ALT}$. If the sum $S_{SUM}$ exceeds the alert threshold $S_{ALT}$, then the controller 110 performs step 456 to generate an alert indicating that a potential fault is present in the battery 102.

FIG. 9B illustrates another example of a flowchart of the CER detection process 446, in an embodiment according to the present invention. Although specific steps are disclosed in FIG. 9B, such steps are examples for illustrative purposes. That is, embodiments according to the present invention are well suited to performing various other steps or variations of the steps recited in FIG. 9B. FIG. 9B is described in combination with FIG. 1, FIG. 2, FIG. 3, FIG. 4 and FIG. 9A.

In an embodiment, the flowchart 446B in FIG. 9B is similar to the flowchart 446A in FIG. 9A except that in the flowchart 446B, the controller 110 performs the step 906 after the step 912 or after the step 452. More specifically, in the example of FIG. 9B, the controller 110 updates the maximum-charge-capacity lookup table LUT6 after determining that the current maximum charge capacity $Q_{MAX\_CHG}$ is within the predicted range, e.g., $dQ_{MAX} < dQ_{PRE}$, or after determining that no potential fault is detected in the battery 102.

FIG. 10 illustrates an example of a flowchart of the CVR detection process 448, in an embodiment according to the present invention. Although specific steps are disclosed in FIG. 10, such steps are examples for illustrative purposes. That is, embodiments according to the present invention are well suited to performing various other steps or variations of the steps recited in FIG. 10. FIG. 10 is described in combination with FIG. 1, FIG. 2, FIG. 3 and FIG. 4.

As mentioned above, "CVR" can be referred to as cell voltage variation rate. The CVR detection process 448 can be performed when the battery 102 is in a relatively stable state, e.g., the charging/discharging current and battery temperature are relatively stable. In the relatively stable state, an increase rate of the battery voltage in a charging mode, or a decrease rate of the battery in a discharging mode, is also relatively stable. If the battery 102 is in a charging mode, and if an increase rate of the battery voltage is less than a reference value, then a potential fault may be present in the battery 102. The reference value is a selected design value known to correlate with the presence of a potential fault, and is set low enough to avoid false indications of a potential fault but high enough to predict the presence of a potential fault. In the example of FIG. 10, the controller 110 performs the CVR detection process 448 to predict the presence of a potential fault.

Similarly, if the battery 102 is in a discharging mode, and if a decrease rate of the battery voltage is greater than a reference value (a selected design value known to correlate with the presence of a potential fault, and set high enough to avoid false indications of a potential fault but low enough to predict the presence of a potential fault), then a potential fault may be present in the battery 102. The controller 110 may perform a similar detection process to predict the potential fault.

As shown in FIG. 10, at step 1002, e.g., at time $t_G$, the controller 110 starts a timer (e.g., a CVR timer) to count time, and at step 1004, the controller 110 reads a set of real-time values of a battery voltage V1, a battery temperature T1, and a battery current I1 from the status register 124. At step 1006, when a predetermined length of a time frame expires, e.g., at time $t_H$, the controller 110 performs step 1008 to read another set of real-time values of a battery voltage V2, a battery temperature T2, and a battery current I2 from the status register 124.

At step 1010, the controller 110 determines whether the battery 102 is in a relatively stable state, e.g., by comparing an absolute difference between the temperatures T1 and T2 with a temperature difference threshold $dT_{PRE6}$ and comparing an absolute difference between the battery currents I1 and I2 with a current difference threshold $dI_{PRE6}$. If the absolute difference |T2−T1| is less than the threshold $dT_{PRE6}$ and the absolute difference |I2−I1| is less than the threshold $dI_{PRE6}$, then the battery is considered to be in a relatively stable state and the flowchart 448 goes to step 1012.

At step 1012, the controller 110 calculates a current voltage change dV, e.g., |V2−V1|, of the battery 102 in the current time frame, e.g., from $t_G$ to $t_H$.

At step 1014, the controller 110 determines whether the current voltage change dV is within a predicted range by, e.g., comparing the current voltage change dV with a preset reference $dV_{CHG}$. The preset reference is a selected design value known to correlate with the presence of a potential fault, and is set low enough to avoid false indications of a potential fault but high enough to predict the presence of a potential fault. If the current voltage change dV is greater than the preset reference $dV_{CHG}$, then the current voltage change dV is considered to be within the predicted range, and the flowchart 448 goes to step 1000. If the current voltage change dV is less than the preset reference $dV_{CHG}$, then the current voltage change dV is considered to be not within the predicted range, and therefore the controller 110 performs a prediction process to predict whether a potential fault is present in the battery 102. For example, the flowchart 448 goes to step 1018.

At step 1018, the controller 110 compares the current voltage change dV with a voltage change threshold $dV_{ALT6}$ ($dV_{ALT6} < dV_{CHG}$). The voltage change threshold is a selected design value known to correlate with the presence of a potential fault, and is set low enough to avoid false indications of a potential fault but high enough to predict the presence of a potential fault. If the current voltage change dV is less than the voltage change threshold $dV_{ALT6}$, then the controller 110 determines that a potential fault is present in the battery 102, and the controller 110 performs step 1016 to generate an alert signal. If the current voltage change dV is greater than the voltage change threshold $dV_{ALT6}$, then the controller 110 performs the fuzzy logic loop 400.

In the fuzzy logic loop 400, the controller 110 performs step 1020 to calculate a ratio of the voltage change threshold $dV_{ALT6}$ to the current voltage change dV, and multiplies the ratio $dV_{ALT6}/dV$ by a sixth weighting factor W6 to generate a calculation result W6×($dV_{ALT6}/dV$). The controller 110 predicts whether a potential fault is present in the battery 102 based on the calculation result W6×($dV_{ALT6}/dV$). For example, at step 452, the controller 110 calculates a sum $S_{SUM}$ of a set of calculation results that include the result W6×($dV_{ALT6}/dV$), and compares the sum $S_{SUM}$ with the alert threshold $S_{ALT}$. If the sum $S_{SUM}$ exceeds the alert threshold $S_{ALT}$, then the controller 110 performs step 456 to generate an alert indicating that a potential fault is present in the battery 102.

In the example of FIG. 10, the battery 102 performs the CVR detection process 448 in a charging mode. In another example, the battery 102 can perform a similar process in a discharging mode. For example, in the discharging mode, at a step similar to the step 1014, the controller 110 can compare the current voltage change dV with another preset reference $dV_{DSG}$ (another selected design value known to correlate with the presence of a potential fault, and set high enough to avoid false indications of a potential fault but low enough to predict the presence of a potential fault). If the current voltage change dV is less than the preset reference $dV_{DSG}$, then the flowchart goes to step 1000. If the current voltage change dV is greater than the preset reference $dV_{DSG}$, then the controller 110 further compares the current voltage change dV with a voltage change threshold $dV_{ALT7}$ ($dV_{ALT7} > dV_{DSG}$). This voltage change threshold is a selected design value known to correlate with the presence of a potential fault, and is set high enough to avoid false indications of a potential fault but low enough to predict the presence of a potential fault. If the current voltage change dV is greater than the voltage change threshold $dV_{ALT7}$, then the controller 110 generates an alert signal. If the current voltage change dV is less than the voltage change threshold $dV_{ALT7}$, then the controller 110 calculates a ratio of the current voltage change dV to the voltage change threshold $dV_{ALT7}$, and multiplies the ratio $dV/dV_{ALT7}$ with a seventh weighting factor W7 to generate a calculation result W7×($dV/dV_{ALT7}$). The controller 110 calculates a sum $S_{SUM}$ of a set of calculation results that include the result W7×($dV/dV_{ALT7}$), and compares the sum $S_{SUM}$ with the alert threshold $S_{ALT}$ to predict whether a potential fault is present in the battery 102.

Accordingly, the controller 110 can predict whether a potential fault, e.g., a potential internal short circuit, is present in the battery 102 by performing one or more or all of the above processes, e.g., the processes 438, 440, 442, 444, 446 and 448, to generate a set of calculation results, and then comparing the sum $S_{SUM}$ of the calculation results with an alert threshold $S_{ALT}$. For example, the controller 110 can perform the SDR detection process 438 to generate a first calculation result W1×($dV/dV_{ALT1}$), perform the TCR detection process 440 to generate a second calculation result W2×($dt/dt_{ALT2}$), perform the CTR detection process 442 to generate a third calculation result W3×($dT/dT_{ALT3}$), perform the CIR detection process 444 to generate a fourth calculation result W4×($dT_{INT}/dR_{ALT4}$), perform the CER detection process 446 to generate a fifth calculation result W5×($dQ_{MAX}/dQ_{ALT5}$), and perform the CVR detection process 448 to generate a sixth calculation result W6×($dV_{ALT6}/dV$). If the sum $S_{SUM}$ of these calculation results exceeds the alert threshold $S_{ALT}$, then the controller 110 determines that a potential fault is present in the battery 102.

In an embodiment, the abovementioned thresholds, e.g., $S_{ALT}$, $dV_{ALT1}$, $dt_{ALT2}$, $dT_{ALT3}$, $dR_{ALT4}$, $dQ_{ALT5}$ and/or $dV_{ALT6}$, can be selected design values known to correlate with presence of a potential fault. These thresholds can be determined by experimental data obtained from modeling experiments.

In an embodiment, the weighing factors W1, W2, W3, W4, W5 and W6 are design values that are selected based on the importance levels of their corresponding data (e.g., $dV/dV_{ALT1}$, $dt/dt_{ALT2}$, $dT/dT_{ALT3}$, $dR_{INT}/dR_{ALT4}$, $dQ_{MAX}/dQ_{ALT5}$, and $dV_{ALT6}/dV$) obtained from the processes 438, 440, 442, 444, 446 and 448, and/or based on the levels of reliability of their corresponding data. Additionally, the importance levels and/or reliability levels of their corresponding data can be determined based on the battery pack's features (e.g., whether it is a new battery pack, how long it has been used, whether the battery pack includes one or more battery cells, whether battery cells in the battery pack are coupled in series or in parallel, etc.), and/or based on the battery pack's application environment (e.g., the ambient temperature, whether it is used in a mobile phone, a laptop, or another type of portable device, etc.). Moreover, in an embodiment, the sum of all the weighting factors W1, W2, W3, W4, W5 and W6 are normalized to one (e.g., W1+W2+W3+W4+W5+W6=1).

Figure 11:
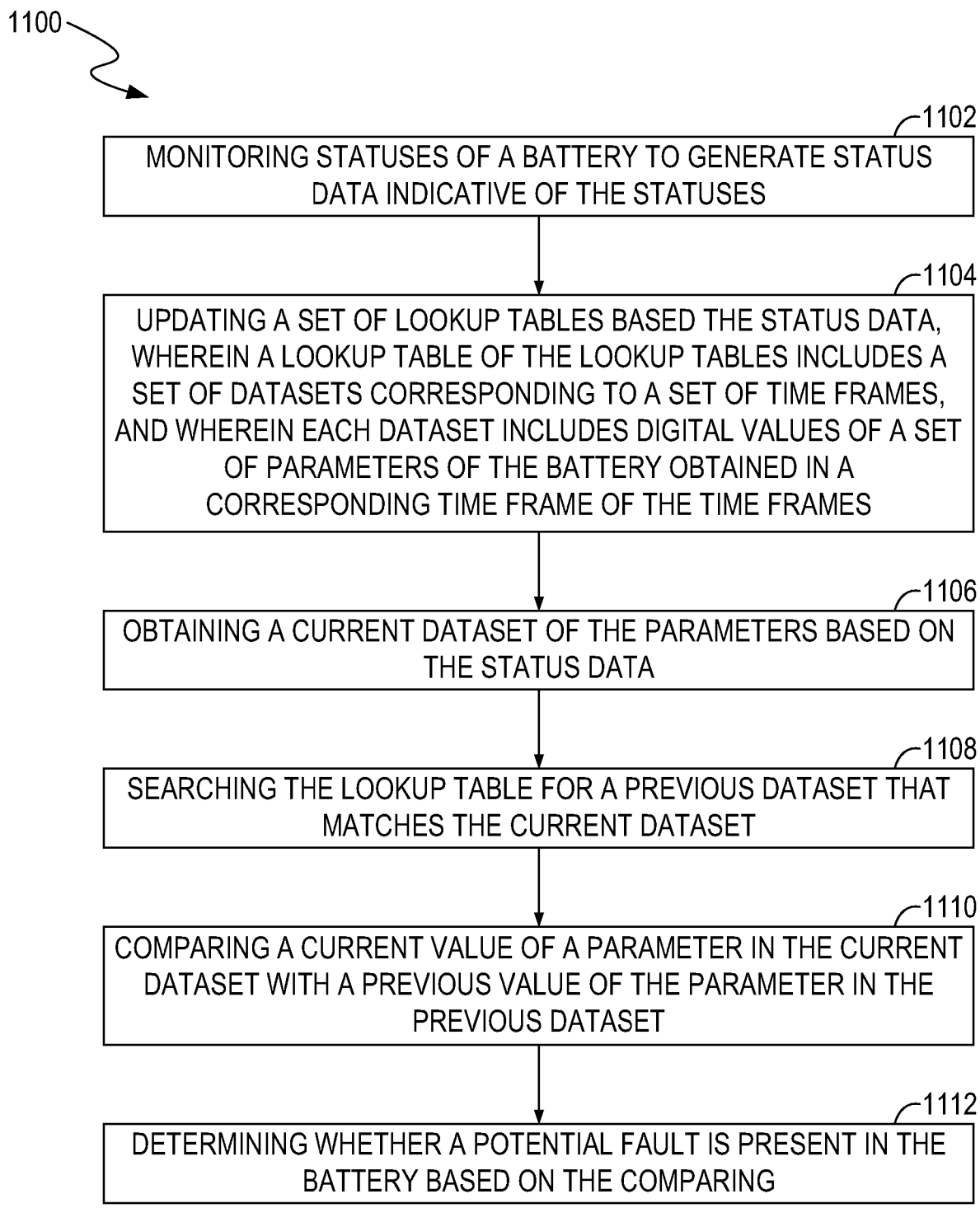
FIG. 11 illustrates a flowchart of examples of operations performed by a status detection system, in an embodiment of the present invention.

FIG. 11 illustrates a flowchart 1100 of examples of operations performed by a status detection system 100, in an embodiment of the present invention. Although specific steps are disclosed in FIG. 11, such steps are examples for illustrative purposes. That is, embodiments according to the present invention are well suited to performing various other steps or variations of the steps recited in FIG. 11. FIG. 11 is described in combination with FIG. 1, FIG. 2, FIG. 3, FIG. 4, FIG. 5, FIG. 6, FIG. 7, FIG. 8A, FIG. 8B, FIG. 9A, FIG. 9B and FIG. 10.

At step 1102, the data acquisition circuit 104 monitors respective statuses of parameters (e.g., a battery voltage, a battery current, and a battery temperature) of the battery 102 to generate status data 118 indicative of the statuses.

At step 1104, the controller 110 updates a set of machine-readable lookup tables (e.g., LUT1, LUT2, LUT3, LUT4, LUT5 and LUT6) stored in a non-transitory machine-readable storage medium 108, based on the status data. A lookup table of the lookup tables includes a set of datasets corresponding to a set of time frames. Each dataset of the datasets includes digital values of a set of parameters of the battery 102 obtained in a corresponding time frame of the time frames. For example, a dataset in the lookup table LUT1 includes dV, AVG_I, AVG_T and AVG_V. As another example, a dataset in the lookup table LUT2 includes dt and AVG_T.

At step 1106, the controller 110 obtains a current dataset of the parameters based on the status data.

At step 1108, the controller 110 searches the lookup table for a previous dataset that matches the current dataset.

At step 1110, the controller 110 compares a current value of a parameter in the current dataset with a previous value of the parameter in the previous dataset. For example, in FIG. 5, the controller 110 compares dV with $dV_0$. As another example, in FIG. 6, the controller 110 compares dt with $dt_0$.

At step 1112, the controller 110 determines whether a potential fault, e.g., a potential internal short circuit, is present in the battery 102 based on a result of the comparison.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

We claim:

1. A system, comprising:
a data acquisition circuit configured to monitor statuses of a battery to generate status data indicative of said statuses;
a non-transitory machine-readable storage medium configured to store a plurality of machine-readable lookup tables, wherein a lookup table of said lookup tables comprises a plurality of datasets corresponding to a plurality of time frames, and wherein each dataset of said plurality of datasets comprises digital values of a plurality of parameters of said battery obtained in a corresponding time frame of said plurality of time frames;
a controller, coupled to said data acquisition circuit and said storage medium, configured to receive said status data and update said lookup tables based on said status data, wherein said controller is configured to obtain a current dataset of said plurality of parameters based on said status data, search said lookup table for a previous dataset that matches said current dataset, perform a comparison of a current value of a parameter in said current dataset and a previous value of said parameter in said previous dataset to determine whether said current value is within a predicted range defined by said previous value,
wherein if said current value is not within said predicted range, then said controller compares said current value with a threshold, and
wherein if said current value is not within said predicted range and does not exceed said threshold, then said controller calculates a ratio of said current value to said threshold, multiplies said ratio by a weighting factor to generate a calculation result, and determines whether a potential fault is present in said battery based on said calculation result.

2. The system of claim 1, wherein said potential fault comprises a potential internal short circuit.

3. The system of claim 1, wherein if said current value is within said predicted range, then said controller updates said lookup table based on said current value.

4. The system of claim 1, wherein if said current value exceeds said threshold, then said controller determines that said potential fault is present.

5. The system of claim 1, wherein said controller is configured to execute a plurality of processes to determine whether said potential fault is present, wherein:
said controller is configured to execute a first process of said plurality of processes, wherein said controller obtains a first value of a first parameter in a first dataset in a first time frame, calculates a first ratio of said first value to a first threshold, and multiplies said first ratio by a first weighting factor to generate a first calculation result, wherein said first dataset corresponds to a first lookup table of said lookup tables;
said controller is configured to execute a second process of said plurality of processes, wherein said controller obtains a second value of a second parameter in a second dataset in a second time frame, calculates a second ratio of said second value to a second threshold, and multiplies said second ratio by a second weighting factor to generate a second calculation result, wherein said second dataset corresponds to a second lookup table of said lookup tables; and said controller is configured to execute a summing process, wherein said controller calculates a sum of a plurality of calculation results that comprise said first and second calculation results.

6. The system of claim 5, wherein if said sum exceeds a predetermined threshold, then said controller determines that said potential fault is present.

7. The system of claim 1, wherein said statuses comprise a battery voltage, a battery current, and a battery temperature of said battery.

8. The system of claim 1, wherein parameters in a dataset in a voltage-change lookup table of said lookup tables comprise a battery voltage change, an average battery current, an average battery temperature, and an average battery voltage,
wherein said controller calculates a current voltage change of said battery in a current time frame, and calculates a current average current, a current average temperature, and a current average voltage of said battery in said current time frame,
wherein said controller searches said voltage-change lookup table for a matching dataset comprising a matching average current, a matching average temperature, and a matching average voltage that are identified as a match to said current average current, said current average temperature, and said current average voltage, respectively, and
wherein said controller determines whether said potential fault is present based on a comparison between said current voltage change and a previous voltage change in said matching dataset.

9. The system of claim 1, wherein parameters in a dataset in a time-length lookup table of said lookup tables comprise a time length and an average battery temperature,
wherein said controller measures a current time length for said battery to change from a close-to-fully-charged status to an end-of-charge status in a current time frame, and calculates a current average temperature of said battery in said current time frame,
wherein said controller searches said time-length lookup table for a matching dataset comprising a matching average temperature that is identified as matching said current average temperature, and
wherein said controller determines whether said potential fault is present based on a comparison between said current time length and a previous time length in said matching dataset.

10. The system of claim 1, wherein parameters in a dataset in a temperature-change lookup table of said lookup tables comprise a battery temperature change and an average battery current,
wherein said controller calculates a current temperature change of said battery in a current time frame, and calculates a current average current of said battery in said current time frame,
wherein said controller searches said temperature-change lookup table for a matching dataset comprising a matching average current that is identified as matching said current average current, and
wherein said controller determines whether said potential fault is present based on a comparison between said current temperature change and a previous temperature change in said matching dataset.

11. The system of claim 1, wherein parameters in a dataset in a resistance lookup table of said lookup tables comprise an internal resistance and a state of charge,
wherein said controller obtains a current internal resistance of said battery in a current time frame, and obtains a current state of charge of said battery in said current time frame,
wherein said controller searches said resistance lookup table for a matching dataset comprising a matching state of charge that is identified as matching said current state of charge, and
wherein said controller determines whether said potential fault is present based on a difference between said current internal resistance and a previous internal resistance in said matching dataset.

12. The system of claim 1, wherein a parameter in a dataset in a maximum-charge-capacity lookup table of said lookup tables comprises an estimated value of a maximum charge capacity of said battery,
wherein in a current charging cycle, said controller estimates a current maximum charge capacity of said battery when said battery enters an end-of-charge state,
wherein said controller obtains a previous maximum charge capacity of said battery, estimated in a previous discharging cycle, from said maximum-charge-capacity lookup table, and
wherein said controller determines whether said potential fault is present based on a difference between said current maximum charge capacity and said previous maximum charge capacity.

13. A method for detecting a potential fault in a battery, said method comprising:
monitoring statuses of said battery to generate status data indicative of said statuses;
updating a plurality of machine-readable lookup tables, stored in a non-transitory machine-readable storage medium, based said status data, wherein a lookup table of said lookup tables comprises a plurality of datasets corresponding to a plurality of time frames, and wherein each dataset of said plurality of datasets comprises digital values of a plurality of parameters of said battery obtained in a corresponding time frame of said plurality of time frames;
obtaining, using a controller, a current dataset of said plurality of parameters based on said status data;
searching said lookup table for a previous dataset that matches said current dataset;
comparing a current value of a parameter in said current dataset and a previous value of said parameter in said previous dataset to determine whether said current value is within a predicted range defined by said previous value;
if said current value is not within said predicted range, then comparing said current value with a threshold; and
if said current value is not within said predicted range and does not exceed said threshold, then:
calculating a ratio of said current value to said threshold,
multiplying said ratio by a weighting factor to generate a calculation result, and
determining whether said potential fault is present based on said calculation result.

14. The method of claim 13, further comprising:
if said current value is within said predicted range, then updating said lookup table based on said current value.

15. The method of claim 13, further comprising:
if said current value exceeds said threshold, then determining that said potential fault is present.

16. The method of claim 13, further comprising performing a first process, a second process, and a summing process;

wherein said first process comprises:
obtaining a first value of a first parameter in a first dataset in a first time frame, wherein said first dataset corresponds to a first lookup table of said lookup tables;
calculating a first ratio of said first value to a first threshold; and
multiplying said first ratio by a first weighting factor to generate a first calculation result;
wherein said second process comprises:
obtaining a second value of a second parameter in a second dataset in a second time frame, wherein said second dataset corresponds to a second lookup table of said lookup tables;
calculating a second ratio of said second value to a second threshold; and
multiplying said second ratio by a second weighting factor to generate a second calculation result; and
wherein said summing process comprises:
calculating a sum of a plurality of calculation results that comprise said first and second calculation results.

17. A battery pack, comprising:
a battery; and
a status detection system, coupled to said battery, that monitors statuses of said battery to generate status data indicative of said statuses, and updates a plurality of machine-readable lookup tables, stored in a non-transitory machine-readable storage medium, based on said status data,
wherein a lookup table of said lookup tables comprises a plurality of datasets corresponding to a plurality of time frames, wherein each dataset of said plurality of datasets comprises digital values of a plurality of parameters of said battery obtained in a corresponding time frame of said plurality of time frames, and
wherein said status detection system is configured to obtain a current dataset of said plurality of parameters based on said status data, search said lookup table for a previous dataset that matches said current dataset, perform a comparison of a current value of a parameter in said current dataset and a previous value of said parameter in said previous dataset to determine whether said current value is within a predicted range defined by said previous value,
wherein if said current value is not within said predicted range, then said status detection system compares said current value with a threshold, and
wherein if said current value is not within said predicted range and does not exceed said threshold, then said status detection system calculates a ratio of said current value to said threshold, multiplies said ratio by a weighting factor to generate a calculation result, and determines whether a potential fault is present in said battery based on said calculation result.

18. The battery pack of claim 17, wherein if said current value is within said predicted range, then said status detection system updates said lookup table based on said current value.

19. The battery pack of claim 17, wherein if said current value exceeds said threshold, then said status detection system determines that said potential fault is present.

20. The battery pack of claim 17, wherein said status detection system determines whether said potential fault is present by performing a plurality of processes, wherein:
said status detection system performs a first process of said plurality of processes, wherein said status detection system obtains a first value of a first parameter in a first dataset in a first time frame, calculates a first ratio of said first value to a first threshold, and multiplies said first ratio by a first weighting factor to generate a first calculation result, wherein said first dataset corresponds to a first lookup table of said lookup tables; and
said status detection system performs a second process of said plurality of processes, wherein said status detection system obtains a second value of a second parameter in a second dataset in a second time frame, calculates a second ratio of said second value to a second threshold, and multiplies said second ratio by a second weighting factor to generate a second calculation result, wherein said second dataset corresponds to a second lookup table of said lookup tables; and
said status detection system performs a summing process of said plurality of processes, wherein said status detection system calculates a sum of a plurality calculation results that comprise said first and second calculation results.

* * * * *